(12) United States Patent
Ebihara et al.

(10) Patent No.: US 11,842,895 B2
(45) Date of Patent: Dec. 12, 2023

(54) SEMICONDUCTOR DEVICE AND POWER CONVERSION DEVICE

(71) Applicant: Mitsubishi Electric Corporation, Tokyo (JP)

(72) Inventors: Kohei Ebihara, Tokyo (JP); Takaaki Tominaga, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 365 days.

(21) Appl. No.: 17/427,676

(22) PCT Filed: Apr. 11, 2019

(86) PCT No.: PCT/JP2019/015723
§ 371 (c)(1),
(2) Date: Aug. 2, 2021

(87) PCT Pub. No.: WO2020/208761
PCT Pub. Date: Oct. 15, 2020

(65) Prior Publication Data
US 2022/0149163 A1 May 12, 2022

(51) Int. Cl.
*H01L 29/78* (2006.01)
*H01L 29/417* (2006.01)
(Continued)

(52) U.S. Cl.
CPC ........ *H01L 29/417* (2013.01); *H01L 29/0619* (2013.01); *H01L 29/41741* (2013.01);
(Continued)

(58) Field of Classification Search
CPC ... H01L 21/0445–0495; H01L 23/3192; H01L 23/24; H01L 23/562; H01L 23/564;
(Continued)

(56) References Cited

U.S. PATENT DOCUMENTS

2008/0079079 A1  4/2008 Noguchi et al.
2008/0277668 A1  11/2008 Okuno et al.
(Continued)

FOREIGN PATENT DOCUMENTS

DE  112019006756 T5 * 1/2019
JP    6-244405 A    9/1994
(Continued)

OTHER PUBLICATIONS

Ebihara et al., English translation of Foreign document, "WO 2020/0157815", which has earlier filing date & same as, US Pub 2021/0399144. (Year: 2020).*
(Continued)

*Primary Examiner* — Kevin J Comber
*Assistant Examiner* — Nusrat Quddus
(74) *Attorney, Agent, or Firm* — XSENSUS LLP

(57) ABSTRACT

An SBD includes: a terminal well region formed to surround an active region; a field insulating film formed to cover part of the terminal well region; a surface electrode formed on a drift layer on an inner side in relation to the field insulating film and electrically connected to the terminal well region; a surface protection film covering an end portion on an outer side of the surface electrode; and a back surface electrode formed on a back surface of a single crystal substrate. An end portion of an outer side of the surface electrode in the corner portion of the terminal region is located on an inner side in relation to the end portion of the outer side of the surface electrode in a straight portion of a terminal region based on a position of an end portion of an outer side of the terminal well region.

12 Claims, 14 Drawing Sheets

(51) Int. Cl.
*H01L 29/06* (2006.01)
*H02M 1/08* (2006.01)
*H01L 23/29* (2006.01)
*H01L 23/31* (2006.01)
*H01L 29/16* (2006.01)
*H02M 7/5387* (2007.01)
*H02P 27/08* (2006.01)

(52) U.S. Cl.
CPC .......... *H01L 29/7811* (2013.01); *H02M 1/08* (2013.01); *H01L 23/293* (2013.01); *H01L 23/3171* (2013.01); *H01L 29/1608* (2013.01); *H02M 7/53871* (2013.01); *H02P 27/08* (2013.01)

(58) Field of Classification Search
CPC . H01L 23/3171; H01L 27/04; H01L 27/0766; H01L 29/06; H01L 29/12; H01L 29/161–167; H01L 29/336; H01L 29/417; H01L 29/41741; H01L 29/66143; H01L 29/66212; H01L 29/66136; H01L 29/78; H01L 29/739; H01L 29/868; H01L 29/872–8725; H01L 29/66053–66068; H01L 29/41775; H01L 29/402; H01L 21/336; H01L 21/28; H02M 1/08
See application file for complete search history.

(56) References Cited

U.S. PATENT DOCUMENTS

| | | |
|---|---|---|
| 2015/0001554 A1 | 1/2015 | Imai |
| 2020/0127098 A1 | 4/2020 | Yamashiro et al. |
| 2021/0399144 A1* | 12/2021 | Ebihara ............... H01L 29/1608 |

FOREIGN PATENT DOCUMENTS

| | | |
|---|---|---|
| JP | 2006-319040 A | 11/2006 |
| JP | 2007-19412 A | 1/2007 |
| JP | 2008-85188 A | 4/2008 |
| JP | 2008-282972 A | 11/2008 |
| JP | 2013-211503 A | 10/2013 |
| JP | 2017-126770 A | 7/2017 |
| WO | 2018/084020 A1 | 5/2018 |
| WO | WO-2020184752 A1 * 9/2020 ........... B62B 5/0069 |

OTHER PUBLICATIONS

Ebihara et al., English translation of Foreign document, "DE 112019006756T5", which has earlier filing date & same as, US Pub 2021/0399144. (Year: 2019).*

International Search Report and Written Opinion dated Jul. 16, 2019, received for PCT Application PCT/JP2019/015723, filed on Apr. 11, 2019, 9 pages including English Translation.

Notice of Reasons for Refusal dated Feb. 12, 2020, received for JP Application 2019-566712, 19 pages including English Translation.

Decision of Refusal dated Apr. 14, 2020, received for JP Application 2019-566712, 19 pages including English Translation.

* cited by examiner

F I G. 1
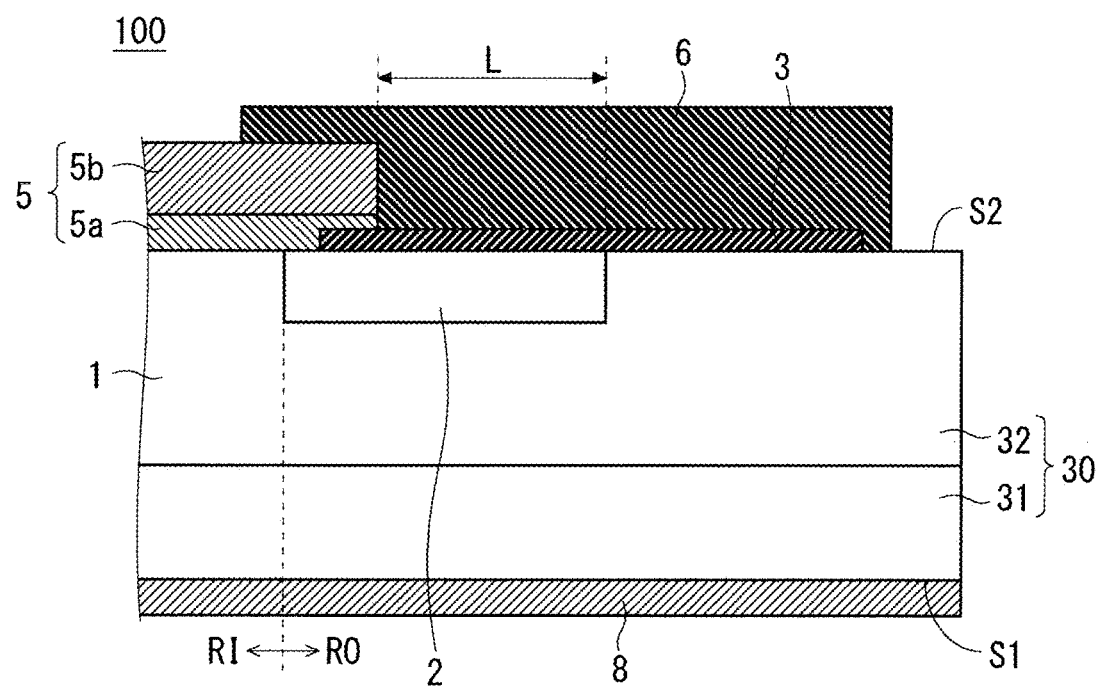

F I G. 3
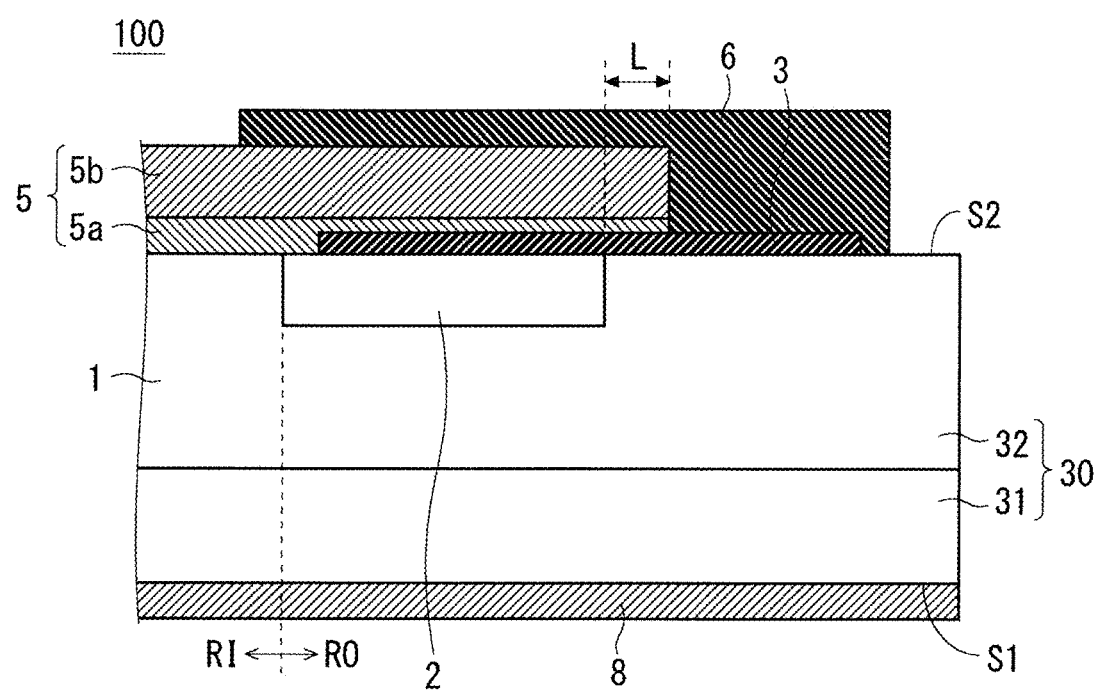

F I G. 7
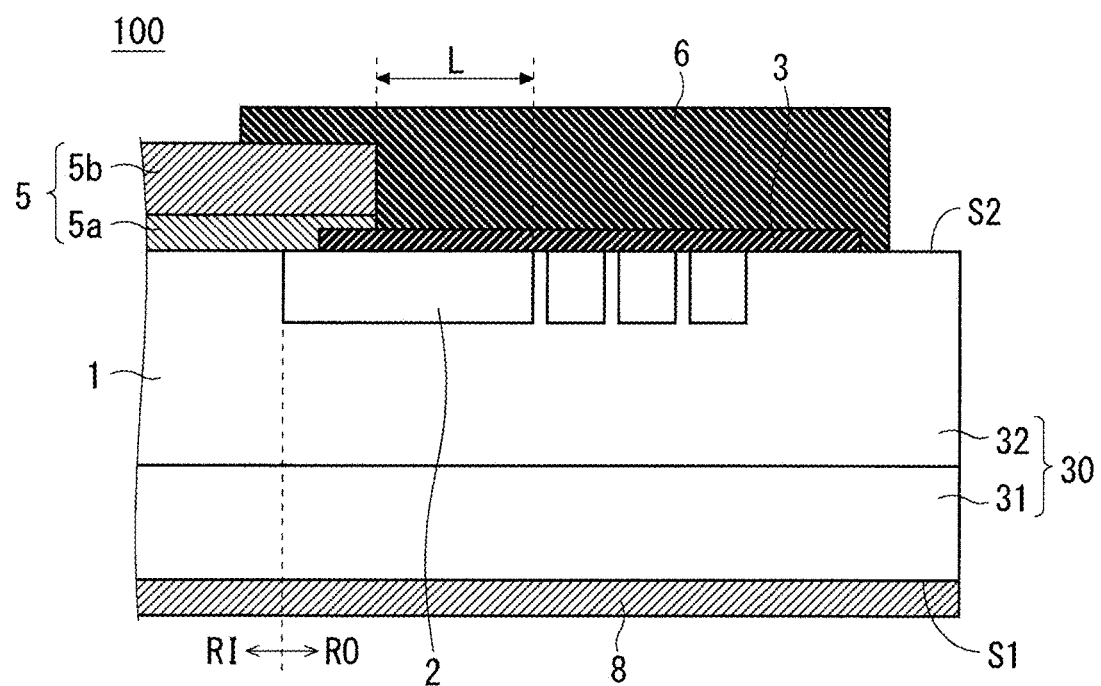

F I G. 8
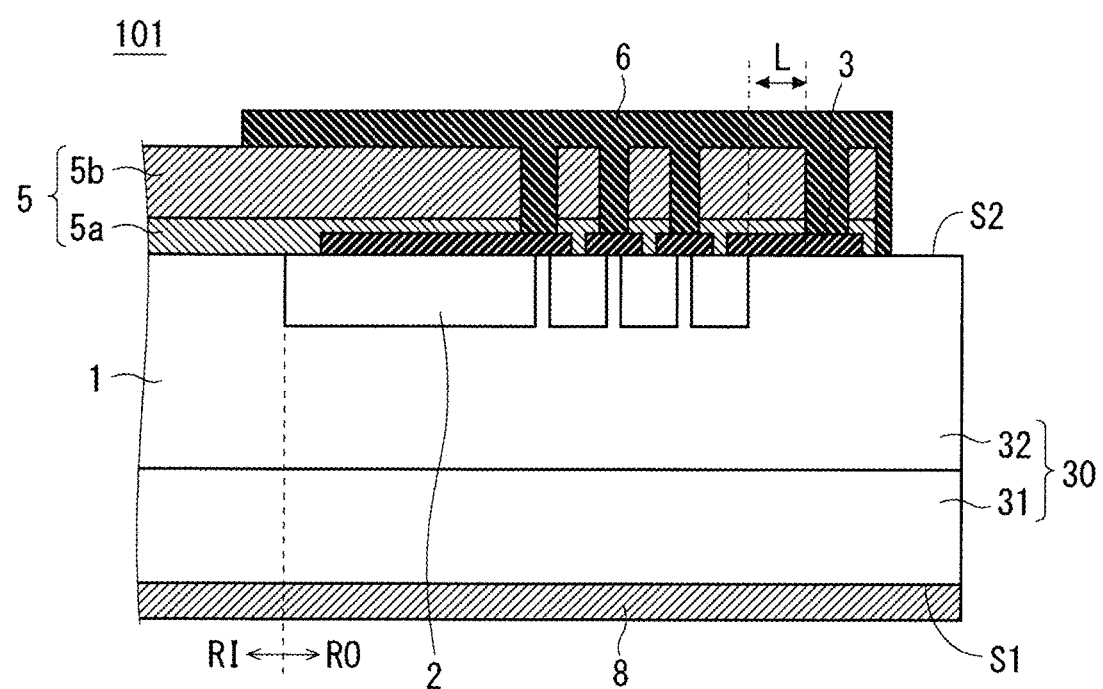

F I G. 9
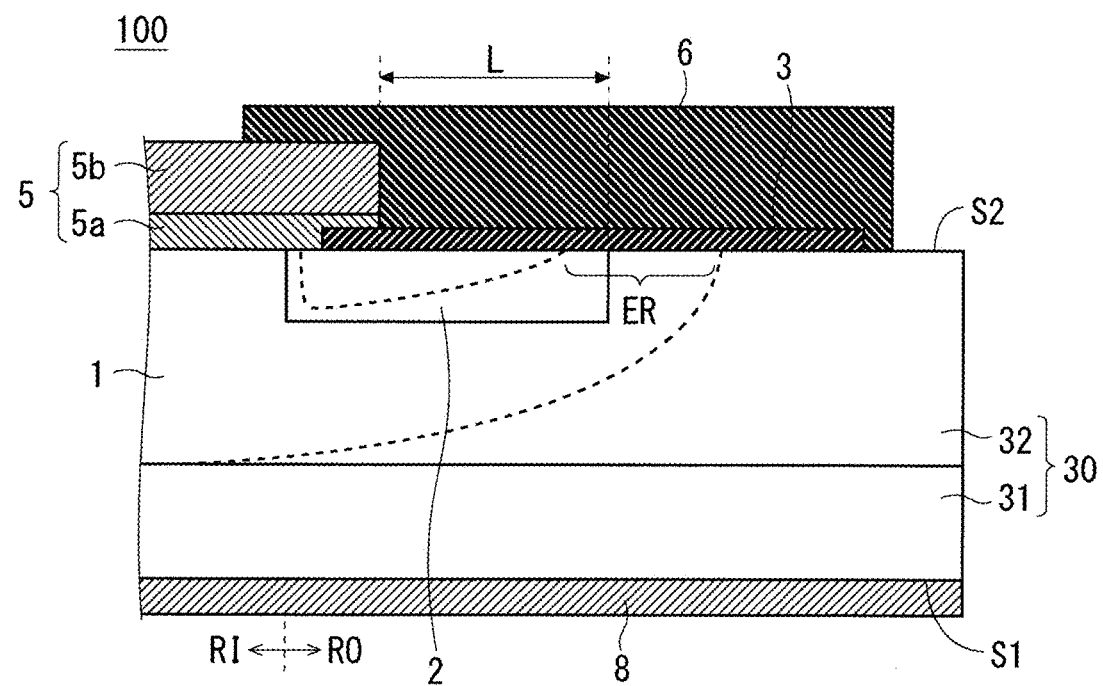

F I G. 1 4
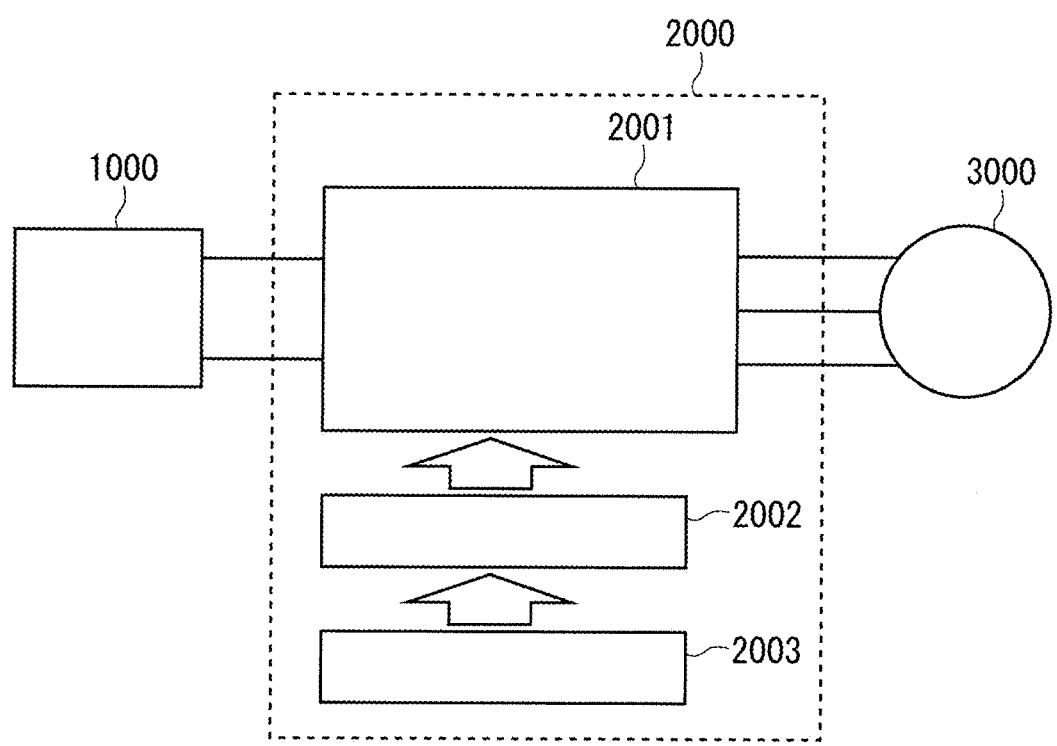

SEMICONDUCTOR DEVICE AND POWER CONVERSION DEVICE

CROSS-REFERENCE TO RELATED APPLICATION

The present application is based on PCT filing PCT/JP2019/015723, filed Apr. 11, 2019, the entire contents of which are incorporated herein by reference.

TECHNICAL FIELD

The present invention relates to a semiconductor device and a power conversion device, and particularly to a semiconductor device having a surface protection film and a power conversion device using the same.

BACKGROUND ART

Known is a technique of providing a p-type guard ring region (a terminal well region) in a so-called terminal region in an outer peripheral portion of an n-type semiconductor layer for securing withstanding pressure performance in a vertical semiconductor device used in a power device, for example (for example, Patent Document 1 described below). In the semiconductor device having the guard ring region, an electrical field generated when reverse voltage is applied to a main electrode of the semiconductor device is reduced by a depletion layer formed by a pn junction between the n-type semiconductor layer and the p-type guard ring region.

In a Schottky barrier diode (SBD) in Patent Document 1, a surface electrode is covered by polyimide as a surface protection film except for a region in which a wire bonding is performed. The Schottky barrier diode is sealed using a sealing material such as gel in some cases. Such a surface protection film and sealing material may be applied not only to the SBD but also to the other semiconductor device such as a metal oxide semiconductor field effect transistor (MOSFET).

PRIOR ART DOCUMENTS

Patent Documents

Patent Document 1: Japanese Patent Application Laid-Open No. 2013-211503

SUMMARY

Problem to be Solved by the Invention

The surface protection film of polyimide and the sealing material such as gel, for example, tend to include moisture under high humidity. This moisture may have a negative effect on the surface electrode. Specifically, there is a case where the surface electrode is transferred into the moisture, or the surface electrode reacts with the moisture and an insulating material is deposited. In such a case, the surface protection film tends to be peeled at an interface between the surface electrode and the surface protection film. There is a possibility that a cavity in a lower portion of the surface protection film on an outer periphery of the surface electrode formed by the peeling of the surface protection film acts as a leak path, and insulation reliability of the semiconductor device is diminished.

The present invention therefore has been made to solve problems as described above, and it is an object of the present invention to provide a semiconductor device having high insulation reliability.

Means to Solve the Problem

A semiconductor device according to the present invention includes: a semiconductor substrate; a drift layer of a first conductive type formed on the semiconductor substrate; at least one terminal well region of a second conductivity type formed on a surface layer portion of the drift layer to surround an active region in a plan view in a terminal region outside the active region; a field insulating film formed to cover part of the terminal well region on the drift layer; a surface electrode formed on the drift layer on an inner side in relation to the field insulating film and electrically connected to the terminal well region; an upper surface film formed on the field insulating film and the surface electrode to cover an end portion on an outer side of the surface electrode; and a back surface electrode formed on a back surface of the semiconductor substrate, wherein the terminal region includes a straight portion and a corner portion in a plan view, and an end portion of an outer side of the surface electrode in the corner portion of the terminal region is located on an inner side in relation to the end portion of the outer side of the surface electrode (5; 50) in the straight portion of the terminal region based on a position of an end portion of an outer side of the terminal well region.

Effects of the Invention

According to the semiconductor device of the present invention, a deposition of an insulating material on the surface electrode is suppressed in a corner portion of the terminal region, and a peeling of the upper surface film can be avoided. Thus, the present invention can contribute to increase in insulation reliability of the semiconductor device.

These and other objects, features, aspects and advantages of the present invention will become more apparent from the following detailed description when taken in conjunction with the accompanying drawings.

BRIEF DESCRIPTION OF DRAWINGS

FIG. 1 A partial cross-sectional view illustrating a configuration of a semiconductor device according to an embodiment 1 of the present invention.

FIG. 3 A partial cross-sectional view illustrating a configuration of the semiconductor device according to the embodiment 1 of the present invention.

FIG. 7 A partial cross-sectional view illustrating a configuration of the semiconductor device according to the embodiment 1 of the present invention.

FIG. 8 A partial cross-sectional view illustrating a configuration of a modification example of the semiconductor device according to the embodiment 1 of the present invention.

FIG. 9 A drawing for explaining an operation of the semiconductor device according to the embodiment 1 of the present invention.

FIG. 14 A block diagram illustrating a configuration of a power conversion system to which a power conversion device according to an embodiment 3 of the present invention is applied.

DESCRIPTION OF EMBODIMENT(S)

Figure 2:
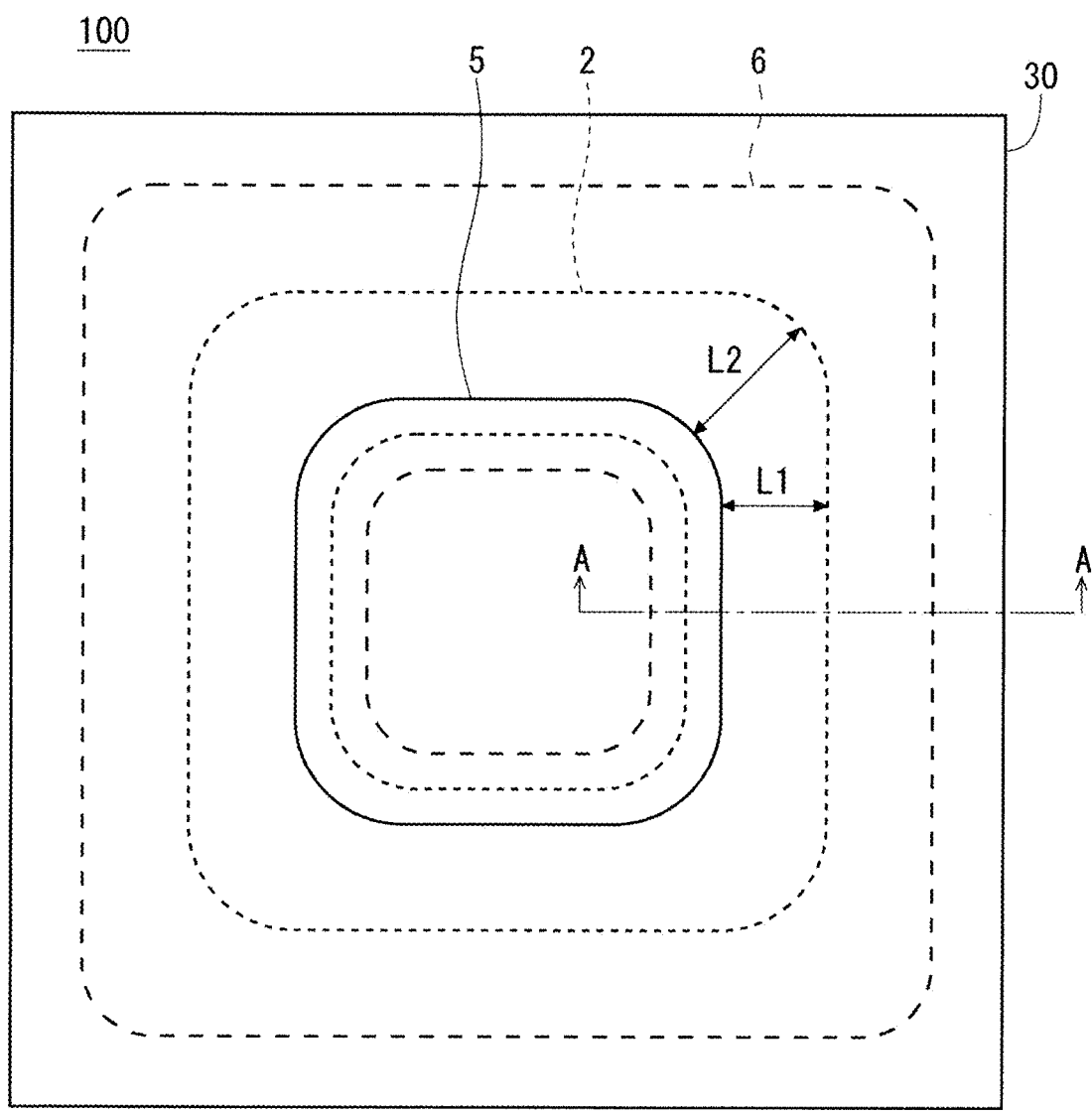
FIG. 2 A plan view illustrating a configuration of the semiconductor device according to the embodiment 1 of the present invention.

Embodiments of the present invention are described hereinafter. In the description, "an active region" in a semiconductor device is defined as a region in which a main current flows when the semiconductor device is in an ON state, and "a terminal region" in the semiconductor device is defined as a region around the active region. "An outer side" of the semiconductor device means a direction from a center portion toward an outer peripheral portion of the semiconductor device, and "an inner side" of the semiconductor device means a direction opposite to "the outer side". With respect to a conductivity type of an impurity, the description is based on an assumption that "a first conductivity type" is an n type and "a second conductivity type" is a p type, however, also applicable reversely is that "a first conductivity type" is a p type and "a second conductivity type" is an n type.

Herein, a term of "MOS" is formerly used for a lamination structure of metal-oxide-semiconductor, and is considered to be made up of initials of Metal-Oxide-Semiconductor. However, specifically in a field-effect transistor having a MOS structure (simply referred to as "the MOS transistor" hereinafter), materials of a gate insulating film and a gate electrode are improved from a viewpoint of a recent integration and improvement of a manufacturing process. For example, in the MOS transistor, polycrystal silicon is adopted as a material of a gate electrode in place of metal from a viewpoint of a formation of mainly a source and drain in a self-aligned form. A high-dielectric constant material is adopted as the material of the gate insulating film from a viewpoint of improvement of electrical characteristics, however, the material is not necessarily limited to oxide.

Accordingly, the term of "MOS" is not necessarily adopted only to a lamination structure of metal-oxide-semiconductor, and the same applies to the present specification. That is to say, in view of a technical common knowledge, "MOS" is defined to have a meaning of not only an abbreviated word of Metal-Oxide-Semiconductor but also widely includes a lamination structure of conductive body-insulating body-semiconductor.

When there is descriptions of "on . . . " and "cover . . . " in the description hereinafter, they does not hinder presence of an intervening object between the constituent elements. For example, even when there is a description of "B provided on A" or "A covers B", it can mean that the other constituent element is provided between A and B. Used in the description hereinafter are terms each indicating a specific position or direction such as "upper side", "lower side", "lateral side", "bottom", "front", and "back", for example, however, these terms are used for convenience of explanation, and do not relate to a direction in an actual use.

The drawings described hereinafter illustrate schematic configurations. A size, a position, and a mutual relationship thereof of elements illustrated in the drawings are not necessarily illustrated accurately, but may be appropriately changed. A mutual relationship of sizes and positions of elements illustrated in the different drawing is not also necessarily accurately illustrated, but can be appropriately changed.

In each drawing, the same reference numerals will be assigned to constituent elements having names and functions similar to those in the other drawings. Thus, a description of the elements similar to those described already using the other drawings is omitted in some cases to avoid a redundant description.

Embodiment 1

[Configuration of Device]

FIG. 1 is a partial cross-sectional view of a Schottky barrier diode (SBD) 100 which is a semiconductor device according to an embodiment 1 of the present invention. FIG. 2 is a plan view of the SBD 100, and a cross-sectional view along an A-A line in FIG. 2 corresponds to FIG. 1. A left side portion of FIG. 1 is an active region in which main current flows when the SBD 100 is an ON state, and a right side portion in FIG. 1 is a terminal region which is a region outside the active region of the SBD 100. A region corresponding to the active region is referred to as "an inner side region RI" and a region corresponding to the terminal region is referred to as "an outer side region RO" hereinafter.

As illustrated in FIG. 1, the SBD 100 is formed using an epitaxial substrate 30 made up of a single crystal substrate 31 and an epitaxial layer 32 formed on the single crystal substrate 31. The single crystal substrate 31 is a semiconductor substrate made up of n-type (first conductivity type) silicon carbide (SiC), and the epitaxial layer 32 is a semiconductor layer made up of SiC epitaxially grown on the single crystal substrate 31. That is to say, the SBD 100 is SiC-SBD. In the present embodiment, the epitaxial substrate 30 having 4H polytype is used. Herein, an upper side and a lower side of the epitaxial substrate 30 in FIG. 1 are defined as "a front side" and "a back side", respectively, and a main surface on the back side of the epitaxial substrate 30 is referred to as "a back surface S1" and a main surface on the front side thereof is referred to as "a front surface S2".

A p-type (second conductivity type) terminal well region 2 is selectively formed on a surface layer portion on the front side of the epitaxial layer 32 in the terminal region. An n-type region except for the terminal well region 2 in the epitaxial layer 32 constitutes a drift layer 1 in which current flows by drift. An impurity concentration of the drift layer 1 is lower than that of the single crystal substrate 31. Thus, the single crystal substrate 31 has lower resistivity than the drift layer 1. Herein, the impurity concentration of the drift layer 1 is equal to or larger than $1 \times 10^{14}/cm^3$ and equal to or smaller than $1 \times 10^{17}/cm^3$.

As shown by dotted lines in FIG. 2, the terminal well region 2 is a frame-like (ring-like) region surrounding the active region in a plan view, and functions as a so-called guard ring. As illustrated in FIG. 1, assuming that an end portion of an inner side (inner peripheral side) of the terminal well region 2 is a boundary, an inner side of the boundary is defined as the inner side region RI which is the active region and an outer side thereof is defined as the outer side region RO which is the terminal region. The outer side region RO is a frame-like region surrounding the inner side region RI in a plan view, and includes a straight portion which is a straight region along each side of a semiconductor chip and a corner portion which is a curved region connecting the two straight portions extending in different directions.

The terminal well region 2 may include a plurality of regions with different impurity concentrations. The number of the terminal well regions 2 is not limited to one, however, the plurality of terminal well regions 2 disposed separately from each other in a nested form may be provided in the outer side region RO, for example.

A field insulating film 3, a surface electrode 5, and a surface protection film 6 are provided on a front surface S2 of the epitaxial substrate 30. A back surface electrode 8 is provided on the back surface S1 of the epitaxial substrate 30. The illustration of the field insulating film 3 and the surface protection film 6 is omitted in a plan view in FIG. 2. A position of an end portion of the surface protection film 6, that is to say, an outline of the surface protection film 6 is shown by a broken line.

The field insulating film 3 covers part of the terminal well region 2, and goes beyond an end portion of an outer side (also referred to as "an outer peripheral end") of the terminal well region 2 to extend to the outer side of the terminal well region 2. The field insulating film 3 is formed by an insulating material such as $SiO_2$ or SiN, for example, and preferably has a thickness of 10 nm or more. For example, an $SiO_2$ film having a thickness of 1 μm can be used as the field insulating film 3.

The surface electrode 5 is provided on at least part of the front surface S2 of the inner side region RI in the epitaxial substrate 30. In the present embodiment, the surface electrode 5 is made up of a Schottky electrode 5a formed on the front surface S2 of the epitaxial substrate 30 and an electrode pad 5b formed on the Schottky electrode 5a, and end portions of the Schottky electrode 5a and the electrode pad 5b are located on the field insulating film 3.

The Schottky electrode 5a has contact with the drift layer 1 of the inner side region RI and the terminal well region 2 of the outer side region RO. Accordingly, the surface electrode 5 is electrically connected to the terminal well region 2. Metal forming a Schottky junction with the drift layer 1 which is an n-type SiC semiconductor is applicable as a material of the Schottky electrode 5a, and titanium (Ti), molybdenum (Mo), nickel (Ni), gold (Au), or tungsten (W), for example, can be used. A thickness of the Schottky electrode 5a is preferably equal to or larger than 30 nm and equal to or smaller than 300 nm. A Ti film having a thickness of 100 nm can be used as the Schottky electrode 5a, for example.

Metal including one or some of aluminum (Al), copper (Cu), Mo, or Ni or Al alloy such as Al—Si (silicon) can be used as a material of the electrode pad 5b. A thickness of the electrode pad 5b is preferably equal to or larger than 300 nm and equal to or smaller than 10 μm. For example, an Al film having a thickness of 3 μm can be used as the electrode pad 5b.

The surface protection film 6 is an upper surface film provided on the field insulating film 3 and the surface electrode 5 to cover the end portion of the surface electrode 5. More specifically, the surface protection film 6 covers an upper surface end portion and an end surface (side surface) of the electrode pad 5b, and an end surface of the Schottky electrode 5a. Thus, an outer peripheral portion of the upper surface of the electrode pad 5b is covered by the surface protection film 6. However, a center portion of the electrode pad 5b is not covered by the surface protection film 6 so as to be able to function as an external terminal. That is to say, the surface protection film 6 includes an opening part exposing the upper surface of the electrode pad 5b in the inner side region RI as illustrated in FIG. 1. The surface protection film 6 covers at least part of the front surface S2 of the epitaxial substrate 30 in the outer side region RO.

Adoptable as a material of the surface protection film 6 is polyimide which is an insulating material made of resin reducing stress from outside, silicon nitride (SiN) with high resistance capable of discharging external load occurring in gel via an electrode, or a multilayer film made up of these materials stacked in layers, for example.

Metal including one or some of Ti, Ni, Al, Cu, and Au, for example, can be used as a material of the back surface electrode 8.

Herein, in the SBD 100 of the present embodiment, the end portion of the outer side (outer peripheral end) of the surface electrode 5 in the corner portion of the outer side region RO is located on an inner side in relation to the end portion of the outer side of the surface electrode 5 in the straight portion of the outer side region RO based on a position of the end portion (outer peripheral end) of the outer side of the terminal well region 2. That is to say, when a distance from the outer peripheral end of the terminal well region 2 to the outer peripheral end of the surface electrode 5 is L, in a case where the outer peripheral end of the surface electrode 5 is located on an inner side in relation to the outer peripheral end of the terminal well region 2 as illustrated in FIG. 1, a distance L2 in the corner portion of the outer side region RO is larger than a distance L1 in the straight portion of the terminal region (RO) as illustrated in FIG. 2. That is to say, a relationship of L2>L1 is established.

Figure 4:
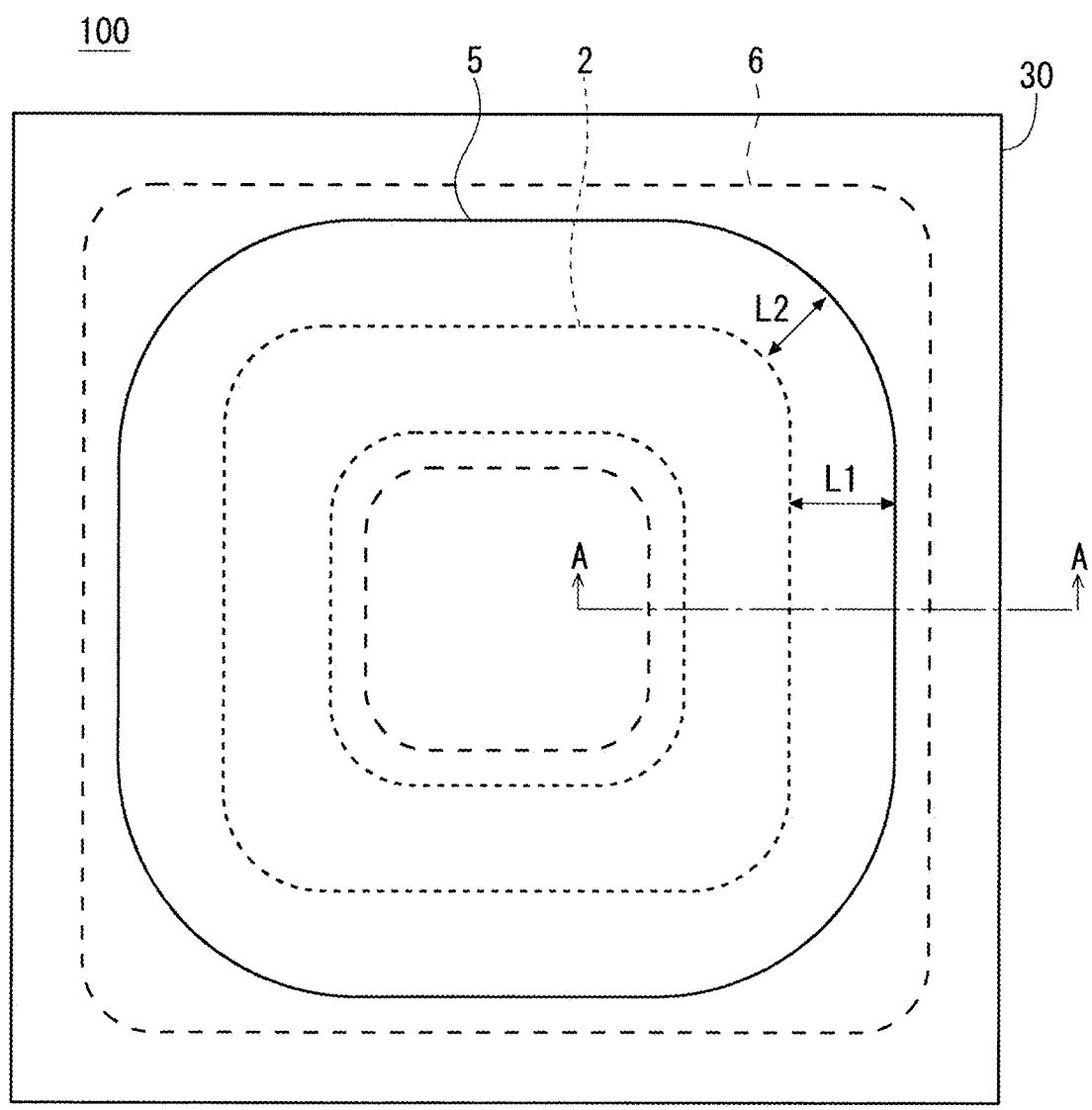
FIG. 4 A plan view illustrating a configuration of the semiconductor device according to the embodiment 1 of the present invention.

Also considered is a case where in the SBD 100 of the present embodiment, the outer peripheral end of the surface electrode 5 is located on an outer side in relation to the outer peripheral end of the terminal well region 2 as illustrated in FIG. 3. In this case, when the distance from the outer peripheral end of the terminal well region 2 to the outer peripheral end of the surface electrode 5 is L, the distance L2 in the corner portion of the outer side region RO is smaller than the distance L1 in the straight portion of the outer side region RO as illustrated in FIG. 4. That is to say, a relationship of L1>L2 is established.

Figure 5:
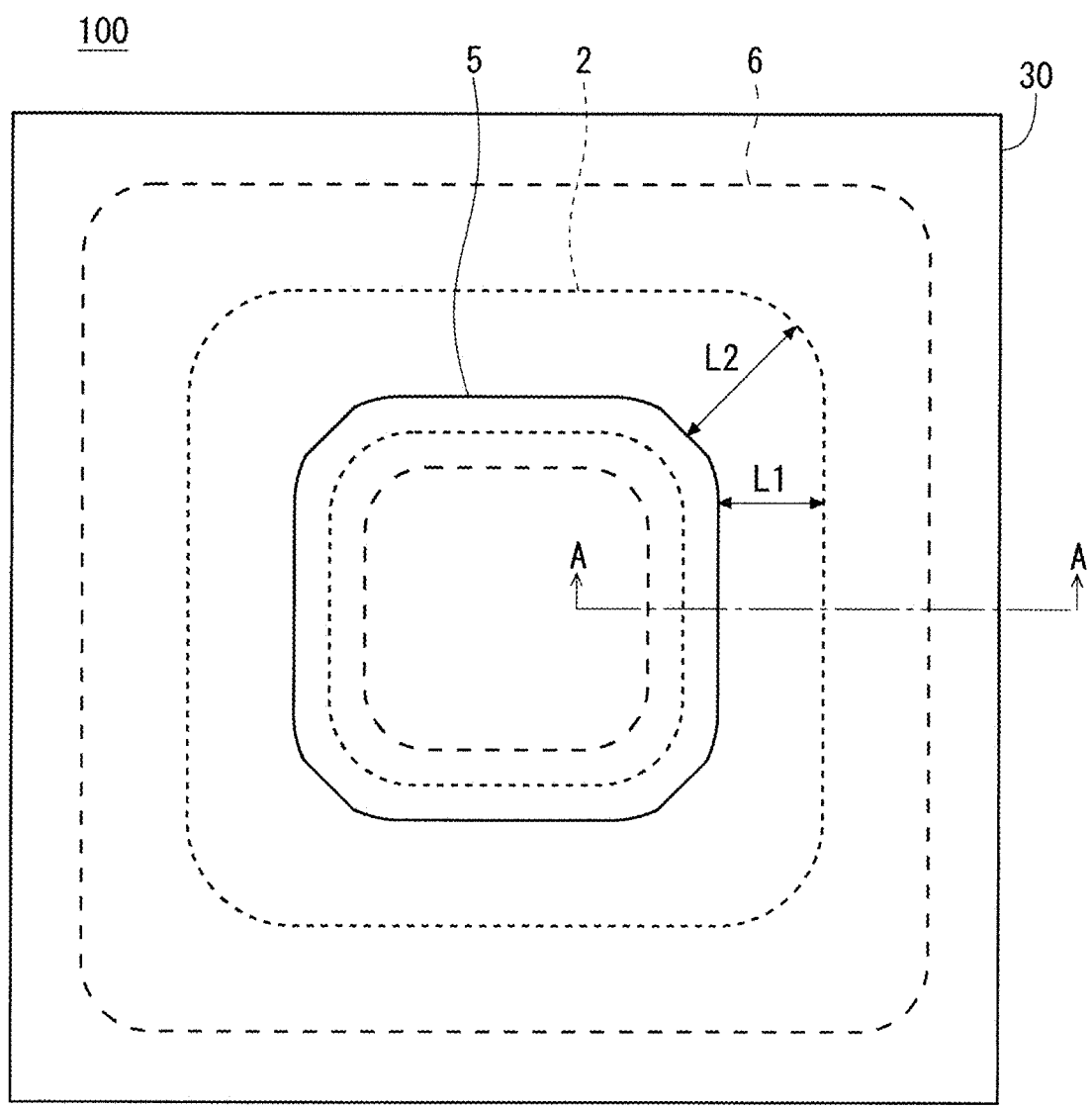
FIG. 5 A drawing illustrating an example of a shape of a surface electrode.
Figure 6:
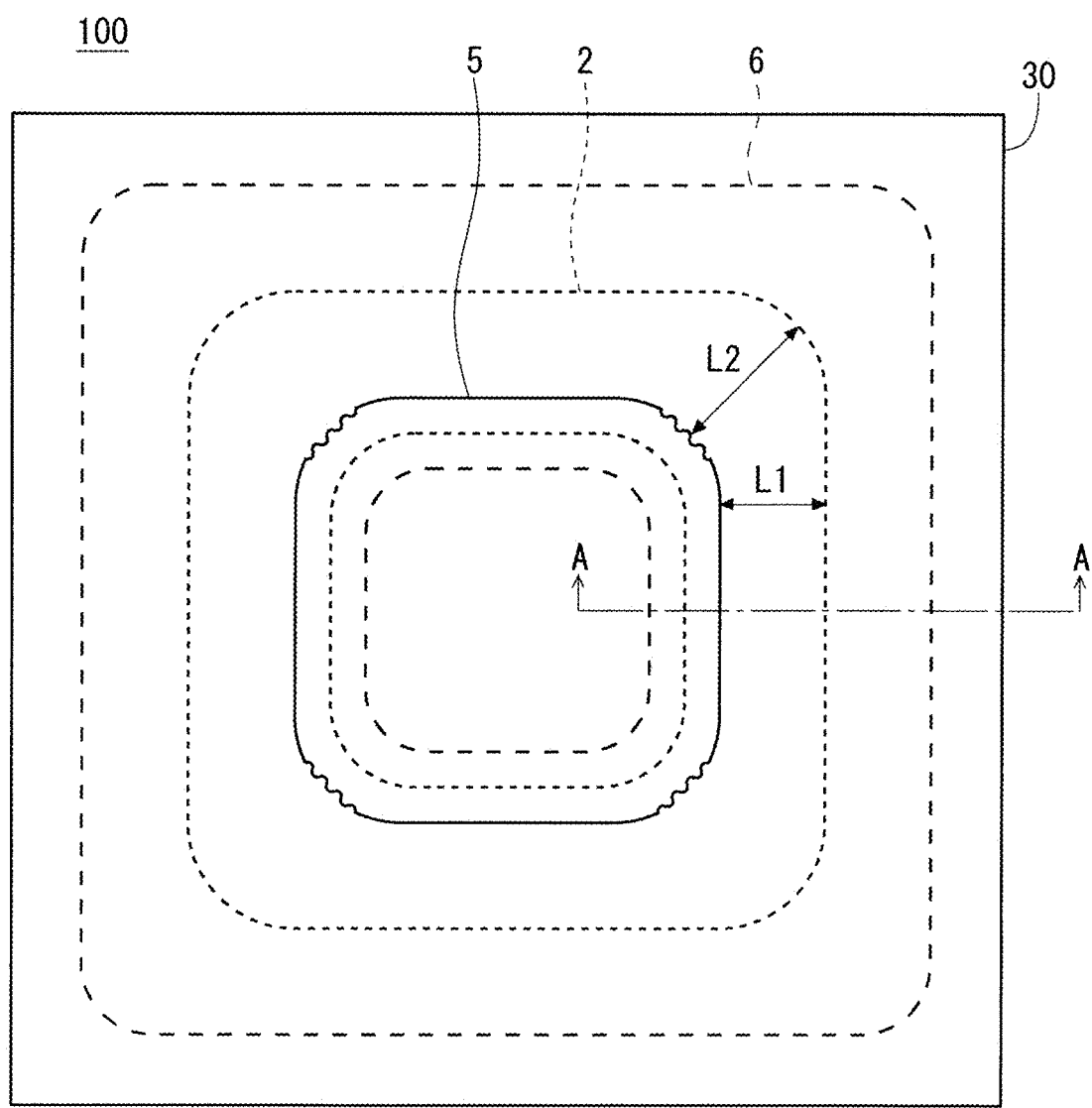
FIG. 6 A drawing illustrating an example of a shape of the surface electrode.

FIG. 2 and FIG. 4, the outer peripheral end of the surface electrode 5 in the corner portion of the outer side region RO (terminal region) has a curved shape, but needs not have the curved shape. For example, as illustrated in FIG. 5, the outer peripheral end of the surface electrode 5 may include a straight portion in the corner portion of the outer side region RO. As illustrated in FIG. 6, the outer peripheral end of the surface electrode 5 may include a plurality of bended portions bended in different directions in the corner portion of the outer side region RO.

As described above, the number of the terminal well regions 2 provided in the outer side region RO is not limited to one, however, the plurality of terminal well regions 2 disposed separately from each other in a nested form may be provided as illustrated in FIG. 7, for example. The surface electrode 5 is electrically connected to at least one of the plurality of terminal well regions 2. In such a case, the outer peripheral end of the surface electrode 5 in the corner portion of the outer side region RO is located on the inner side in relation to the outer peripheral end of the surface electrode 5 in the straight portion of the outer side region RO based on a position of the outer peripheral end of the terminal well region 2 electrically connected to the surface electrode 5 in the plurality of terminal well regions 2.

In the present embodiment, SiC is used as a material of the epitaxial substrate 30. An SiC semiconductor has a wider band gap than an Si semiconductor, and an SiC semiconductor device is excellent in pressure resistance, and has a high allowable current density and heat resistance compared with an Si semiconductor device, thus can be operated under high temperature. The material of the epitaxial substrate 30 is not limited to SiC, however, Si or the other wideband gap semiconductor such as gallium nitride (GaN) is also applicable, for example.

The semiconductor device according to the present embodiment may be a diode such as a pn junction diode or a junction barrier Schottky (JBS) diode, for example, other than the SBD.

Modification Example

FIG. 8 is a cross-sectional view illustrating a configuration of an SBD 101 according to a modification example of the embodiment 1, and is a drawing corresponding to FIG. 1. The plurality of terminal well regions 2 disposed separately from each other in a nested form are provided in the outer side region RO of the SBD 101 in FIG. 8 in the manner similar to FIG. 7. Furthermore, the plurality of surface electrodes 5 are provided in a nested form to be connected to the plurality of terminal well regions 2, respectively.

In this case, the outer peripheral end of the surface electrode 5 in the corner portion of the outer side region RO is located on the inner side in relation to the outer peripheral end of the surface electrode 5 in the straight portion of the outer side region RO based on a position of the outer peripheral end of the terminal well region 2 in each of the plurality of surface electrodes 5 electrically connected to each of the terminal well regions 2.

[Operation]

An operation of the SBD 100 of the embodiment 1 is described. When negative voltage is applied to the back surface electrode 8 based on potential of the surface electrode 5, the SBD 100 enters a state where current flows from the surface electrode 5 to the back surface electrode 8, that is to say, a conduction state (ON state). In contrast, when positive voltage is applied to the back surface electrode 8 based on the potential of the surface electrode 5, the SBD 100 enters a blocking state (OFF state).

When the SBD 100 is in the OFF state, large electrical field is applied to a surface of the inner side region RI (active region) in the drift layer 1 and an area near a pn junction interface between the drift layer 1 and the terminal well region 2. Voltage applied to the back surface electrode 8 at a time when the electrical field reaches a critical electrical field and avalanche breakdown occurs is defined as maximum voltage (avalanche voltage) of the SBD 100. Normally, rated voltage is determined so that the SBD 100 is used within a voltage range in which the avalanche breakdown does not occur.

In the OFF state in the SBD 100, the depletion layer expands in a direction (lower direction) toward the single crystal substrate 31 and an outer peripheral direction (right direction) of the drift layer 1 from the surface of the active region in the drift layer 1 and the pn junction interface between the drift layer 1 and the terminal well region 2. The depletion layer also expands from the pn junction interface between the drift layer 1 and the terminal well region 2 into the terminal well region 2, and a degree of the expansion significantly depends on the concentration of the terminal well region 2. That is to say, when the concentration of the terminal well region 2 increases, the expansion of the depletion layer is suppressed in the terminal well region 2, and a position of an edge of the depletion layer is located near the boundary between the terminal well region 2 and the drift layer 1. The edge of the depletion layer is located in the same position in the straight portion and the corner portion of the terminal region as long as a distance from the region where the surface electrode 5 and the terminal well region 2 are connected to each other and the outer peripheral end of the terminal well region 2 is the same.

FIG. 9 illustrates the position of the edge of the depletion layer expanding in the direction (lower direction) toward the single crystal substrate 31 and the outer peripheral direction (right direction) of the drift layer 1 and the position of the edge of the depletion layer expanding into the terminal well region 2 in the OFF state in the SBD 100 by broken lines. That is to say, a region between the two broken lines illustrated in FIG. 9 is depleted in the OFF state in the SBD 100. The position of the edge of the depletion layer can be checked through a technology CAD (TCAD) simulation, for example. In the outer side region RO, a potential difference occurs from an outer peripheral side of the epitaxial layer 32 toward a center in a depleted region in the epitaxial layer 32. A region which is not depleted in the terminal well region 2 can be considered to have substantial the same potential as the surface electrode 5.

Considered herein is a case where the SBD 100 is in the OFF state under high humidity. A sealing resin provided to cover a semiconductor chip may contain moisture. For example, when the surface protection film 6 is made up of a resin material having high water absorption properties such as polyimide, there is a possibility that the surface protection film 6 contains much moisture under high humidity and the moisture reaches the surfaces of the epitaxial layer 32 and the electrode pad 5b. When the surface protection film 6 is made up of a material such as SiN having high resistance, there is a possibility that a crack occurs easily in the surface protection film 6 around the end portion of the surface electrode 5 by a stress generated in the processes, and the surface electrode 5 is exposed to the moisture through the crack. In such a state, an end edge portion of the drift layer 1 acts as a positive electrode by voltage applied to the SBD 100 in the OFF state, and the electrode pad 5b acts as a negative electrode. A reduction reaction of oxygen expressed by the following chemical formula (1) and a formation reaction of hydrogen expressed by the following chemical formula (2) occur by the moisture near the electrode pad 5b which becomes the negative electrode.

$$O_2 + 2H_2O + 4e^- \rightarrow 4OH^- \tag{1}$$

$$H_2O + e^- \rightarrow OH^- + 1/2 H_2 \tag{2}$$

According to these reactions, a concentration of hydroxide ion increases near the electrode pad 5b. Hydroxide ion chemically reacts with the electrode pad 5b. For example, when the electrode pad 5b is made of aluminum, aluminum is changed into aluminum hydroxide by the chemical reaction described above in some cases.

The reaction of aluminum and hydroxide ion is accelerated by field intensity around an area of reaction. A potential gradient occurs in a depleted region in the semiconductor, thus a potential gradient along the front surface S2 occurs in a region where the depletion layer is exposed to the surface of the epitaxial substrate 30 in the SBD 100 in the embodiment 1 (a region ER illustrated in FIG. 9). The potential gradient is taken over by the field insulating film 3 and the surface protection film 6 on the front surface S2 of the epitaxial layer 32, thus electrical field occurs around the end portion of the electrode pad 5b. When the field intensity in the end portion of the electrode pad 5b is thereby equal to or larger than a predetermined value, a formation reaction of aluminum hydroxide occurs, and the reaction is accelerated in accordance with the increase in the field intensity. The field intensity in the end portion of the electrode pad 5b can be checked through a technology CAD (TCAD) simulation, for example, by setting a shape, dielectric constant, resistivity of each of the surface electrode 5, the field insulating film 3, and the surface protection film 6, for example.

The field intensity in the end portion of the electrode pad 5b increases as the position of the outer peripheral end of the surface electrode 5 gets closer to the outer periphery based on the position of the outer peripheral end of the terminal well region 2. Thus, the generation of aluminum hydroxide is accelerated as the position of the outer peripheral end of the surface electrode 5 gets closer to the outer periphery based on the position of the outer peripheral end of the terminal well region 2.

The field intensity is generally high due to an occurrence of a two-dimensional potential gradient in a corner portion (a curved portion) of the terminal region, thus a deposition of aluminum hydroxide significantly occurs on the surface of the electrode pad 5b. When the surface protection film 6 is pushed up by the deposition of the aluminum hydroxide, the peeling of the surface protection film 6 occurs at an interface between the electrode pad 5b and the surface protection film 6 in some cases.

Particularly when the epitaxial substrate 30 is made of SiC, a width of the terminal well region 2 and a width from the terminal well region 2 to the end edge portion of the drift layer 1 can be designed to be small by using high insulating breakdown electrical field of SiC. In such a design, a distance from the end edge portion of the drift layer 1 which becomes the positive electrode in the OFF state to the electrode pad 5b which becomes the negative electrode decreases. Thus, the field intensity of the terminal region further increases, and the generation of aluminum hydroxide in the end portion of the electrode pad 5b is promoted. As a result, the peeling of the surface protection film 6 from the electrode pad 5b occurs more significantly.

The peeling of the surface protection film 6 extends onto the field insulating film 3 in some cases. In other words, the peeling of the surface protection film 6 also occurs at an interface between the field insulating film 3 and the surface protection film 6 in some cases. If a cavity is formed on the field insulating film 3 by this peeling, there is a possibility that moisture enters the cavity and causes an excess leakage current or an aerial discharge occurs in the cavity, thus an element breakdown occurs in the SBD 100.

In contrast, in the SBD 100 in the embodiment 1, the outer peripheral end of the surface electrode 5 in the corner portion of the terminal region is located on the inner side in relation to the outer peripheral end of the surface electrode 5 in the straight portion of the terminal region based on the position of the outer peripheral end of the terminal well region 2. Thus, the field intensity in the end portion of the electrode pad 5b in the corner portion of the terminal region is smaller than the field intensity of the end potion of the electrode pad 5b in the straight portion of the terminal region. Accordingly, the generation of aluminum hydroxide is suppressed in the end portion of the electrode pad 5b in the corner portion of the terminal region. As a result, obtained is an effect that increase in a leakage current and an aerial discharge caused by the peeling of the surface protection film 6 can be avoided.

When the plurality of terminal well regions 2 separated from each other are provided in a nested form as illustrated in FIG. 7, the field intensity of the end portion of the electrode pad 5b can be further made small, and an effect of suppressing the generation of aluminum hydroxide is further increased.

The effect of suppressing the generation of aluminum hydroxide in the corner portion of the terminal region is also obtained in the plurality of surface electrodes 5 included in the SBD 101 in the modification example of the embodiment 1 (FIG. 8). That is to say, in each of the plurality of surface electrodes 5 in FIG. 8, the outer peripheral end of the surface electrode 5 in the corner portion of the terminal region is located on the inner side in relation to the outer peripheral end of the surface electrode 5 in the straight portion of the terminal region based on the position of the outer peripheral end of the terminal well region 2, thus the field intensity in the end portion of each of the plurality of electrode pads 5b can be made small in the corner portion. Thus, the generation of aluminum hydroxide in the end portion of the electrode pad 5b in the corner portion can be suppressed, and the increase in the leakage current and the aerial discharge caused by the peeling of the surface protection film 6 can be avoided.

[Manufacturing Method]

A method of manufacturing the SBD 100 according to the embodiment 1 is described.

Firstly, a low-resistance single crystal substrate 31 including an n-type impurity at a relatively high concentration (n+) is prepared. In the present embodiment, the single crystal substrate 31 is an SiC substrate having a polytype of 4H, and has an off angle of four degrees or eight degrees.

Subsequently, SiC is epitaxially grown on the single crystal substrate 31 to form the n-type epitaxial layer 32 having an impurity concentration equal to or larger than $1 \times 10^{14}/cm^3$ and equal to or smaller than $1 \times 10^{17}/cm^3$ on the single crystal substrate 31. Accordingly, the epitaxial substrate 30 made up of the single crystal substrate 31 and the epitaxial layer 32 is obtained.

Next, a resist mask having a pattern in which a formation region of the terminal well region 2 is opened is formed on the epitaxial layer 32 by a photolithography process. Then, a p-type impurity (acceptor) such as Al or boron (B) is ion-implanted into the epitaxial layer 32 using the resist mask as an implantation mask to form the p-type terminal well region 2 on a surface layer portion of the epitaxial layer 32. A dose amount of the terminal well region 2 is preferably equal to or larger than $0.5 \times 10^{13}/cm^2$ and equal to or smaller than $5 \times 10^{13}/cm^2$, and can be set to $1.0 \times 10^{13}/cm^2$, for example.

When the p-type impurity is Al, implantation energy of ion implantation is equal to or larger than 100 keV and equal to or smaller than 700 keV, for example. In this case, the impurity concentration of the terminal well region 2 converted from the dose amount [$cm^{-2}$] described above is equal to or larger than $1 \times 10^{17}/cm^3$ and equal to or smaller than $1 \times 10^{19}/cm^3$.

When the plurality of terminal well regions 2 are formed as illustrated in FIG. 7 or FIG. 8, it is also applicable to form a plurality of opening in a nested form in the resist mask as the implantation mask and simultaneously form the plurality of terminal well regions 2 by one ion implantation. Alternatively, it is also applicable that the formation of the implantation mask (patterning of the resist mask) and the ion implantation are repeated several times to form the plurality of terminal well regions 2.

After forming the terminal well region 2, annealing is performed at a temperature equal to or larger than 1300° C. and equal to or smaller than 1900° C. for thirty seconds to one hour in an inactive gas atmosphere such as argon (Ar) gas using a thermal processing device. The impurity added to the epitaxial layer 32 by the ion implantation is activated by the annealing.

Next, an $SiO_2$ film having a thickness of 1 μm is formed on the front surface S2 of the epitaxial substrate 30 by a CVD method, for example. Then, the $SiO_2$ film is patterned by a photolithography process and an etching process to form the field insulating film 3. At this time, the field insulating film 3 is patterned to have a shape of covering part of the terminal well region 2 and going beyond an end portion of the terminal well region 2 to extend to an outer peripheral side of the terminal well region 2.

Subsequently, a material layer of the Schottky electrode 5a and a material layer of the electrode pad 5b are stacked in this order on the epitaxial layer 32 and the field insulating film 3 by a sputtering method, for example. A Ti film having a thickness of 100 nm, for example, can be used as the material layer of the Schottky electrode 5a, and an Al film having a thickness of 3 μm, for example, can be used as the material layer of the electrode pad 5b.

Subsequently, a resist mask having a pattern of the surface electrode 5 is formed on the material layer of the electrode pad 5b by a photolithography process. Then, the material layer of the electrode pad 5b and the material layer of the Schottky electrode 5a are patterned using the resist mask as an etching mask to obtain the surface electrode 5 made up of the Schottky electrode 5a and the electrode pad 5b. At this time, the surface electrode 5 is patterned so that the outer peripheral end of the surface electrode 5 in the corner portion of the terminal region is located on the inner side in relation to the outer peripheral end of the surface electrode 5 in the straight portion of the terminal region based on the position of the outer peripheral end of the terminal well region 2.

When the plurality of surface electrodes 5 are formed as illustrated in FIG. 8, the material layer of the Schottky electrode 5a and the material layer of the electrode pad 5b are patterned to be divided into a plurality of elements.

Dry etching or wet etching can be used for etching of the material layer of the electrode pad 5b and the material layer of the Schottky electrode 5a. In the case of the wet etching, an hydrofluoric acid (HF) or phosphoric acid system etching solution can be used as an etching solution.

The patterning of the Schottky electrode 5a and the patterning of the electrode pad 5b may be performed separately. In this case, a position of the end edge portion of the Schottky electrode 5a and a position of the end edge portion of the electrode pad 5b may be displaced from each other. For example, it is also applicable that the end edge portion of the electrode pad 5b protrudes from the end edge portion of the Schottky electrode 5a and the electrode pad 5b completely covers the Schottky electrode 5a. Alternatively, it is also applicable that the end edge portion of the Schottky electrode 5a protrudes from the end edge portion of the electrode pad 5b, and part of the Schottky electrode 5a is not covered by the electrode pad 5b.

Next, a resin layer which is the material layer of the surface protection film 6 is formed on the front surface S2 of the epitaxial substrate 30 to cover the field insulating film 3 and the surface electrode 5. The resin layer can be formed by applying photoactive polyimide, for example. Subsequently, the resin layer is patterned by a photolithography process to form the surface protection film 6. At this time, the surface protection film 6 on a center portion of the surface electrode 5 which becomes an external connection terminal is removed. The surface protection film 6 is patterned to cover the end edge portion of the surface electrode 5 and at least part of the outer side region RO in the outer side region RO.

Finally, the back surface electrode 8 is formed on the back surface S1 of the epitaxial substrate 30 by a sputtering method, for example, to obtain the SBD 100 illustrated in FIG. 1.

The formation of the back surface electrode 8 may be performed before or after a process of forming the material layer of the Schottky electrode 5a and the material layer of the electrode pad 5b. Metal including one or some of Ti, Ni, Al, Cu, and Au, for example, can be used as a material of the back surface electrode 8. A thickness of the back surface electrode 8 is preferably equal to or larger than 50 nm and equal to or smaller than 2 μm. A Ti/Au double-layered film having a thickness of 1 μm can be used as the back surface electrode 8, for example.

[Outline]

As described above, according to the SBD 100 of the embodiment 1 and the SBD 101 of the modification example of the embodiment 1, the generation of aluminum hydroxide in the end portion of the electrode pad 5b in the corner portion of the terminal region can be suppressed, and the peeling of the surface protection film 6 is thereby avoided. Thus, the increase in the leakage current and the aerial discharge caused by the peeling of the surface protection film 6 can be avoided, and insulation reliability of the SBD can be increased.

Embodiment 2

[Configuration of Device]

Figure 10:
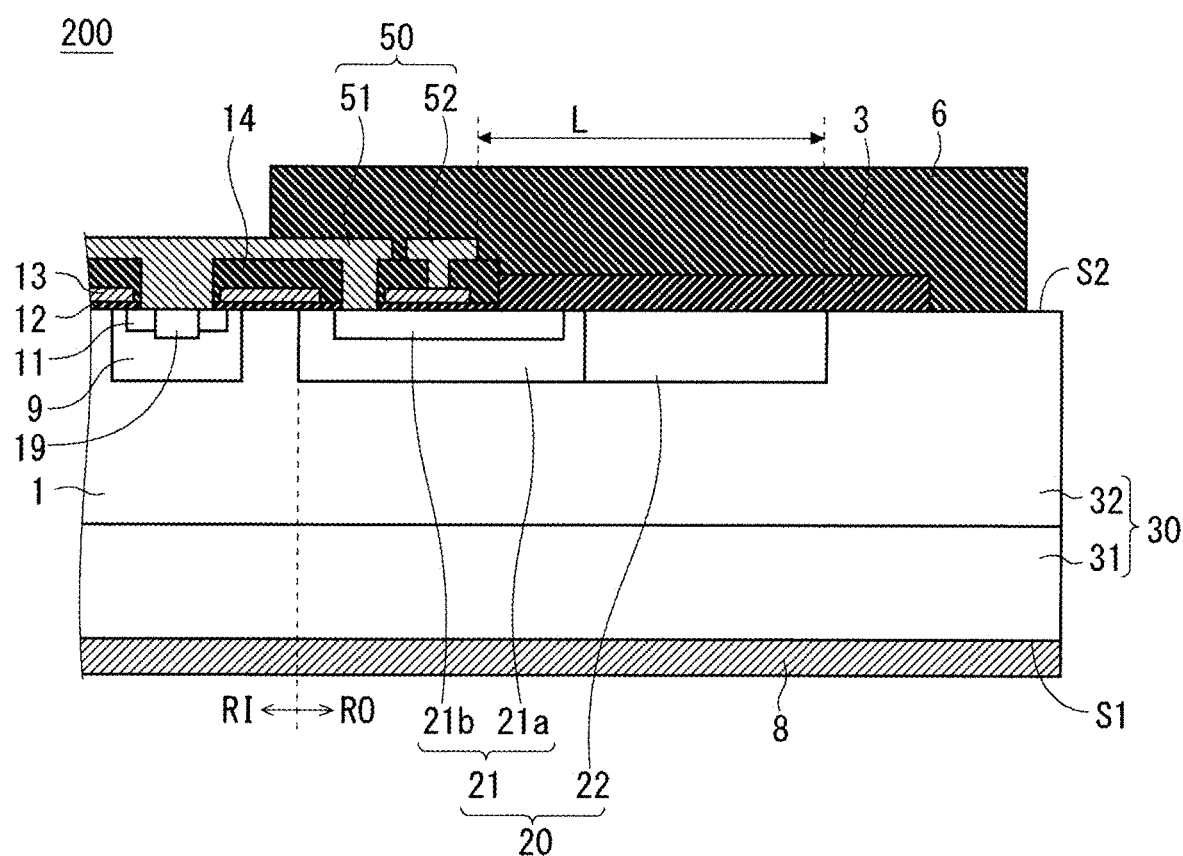
FIG. 10 A partial cross-sectional view illustrating a configuration of a semiconductor device according to an embodiment 2 of the present invention.
Figure 11:
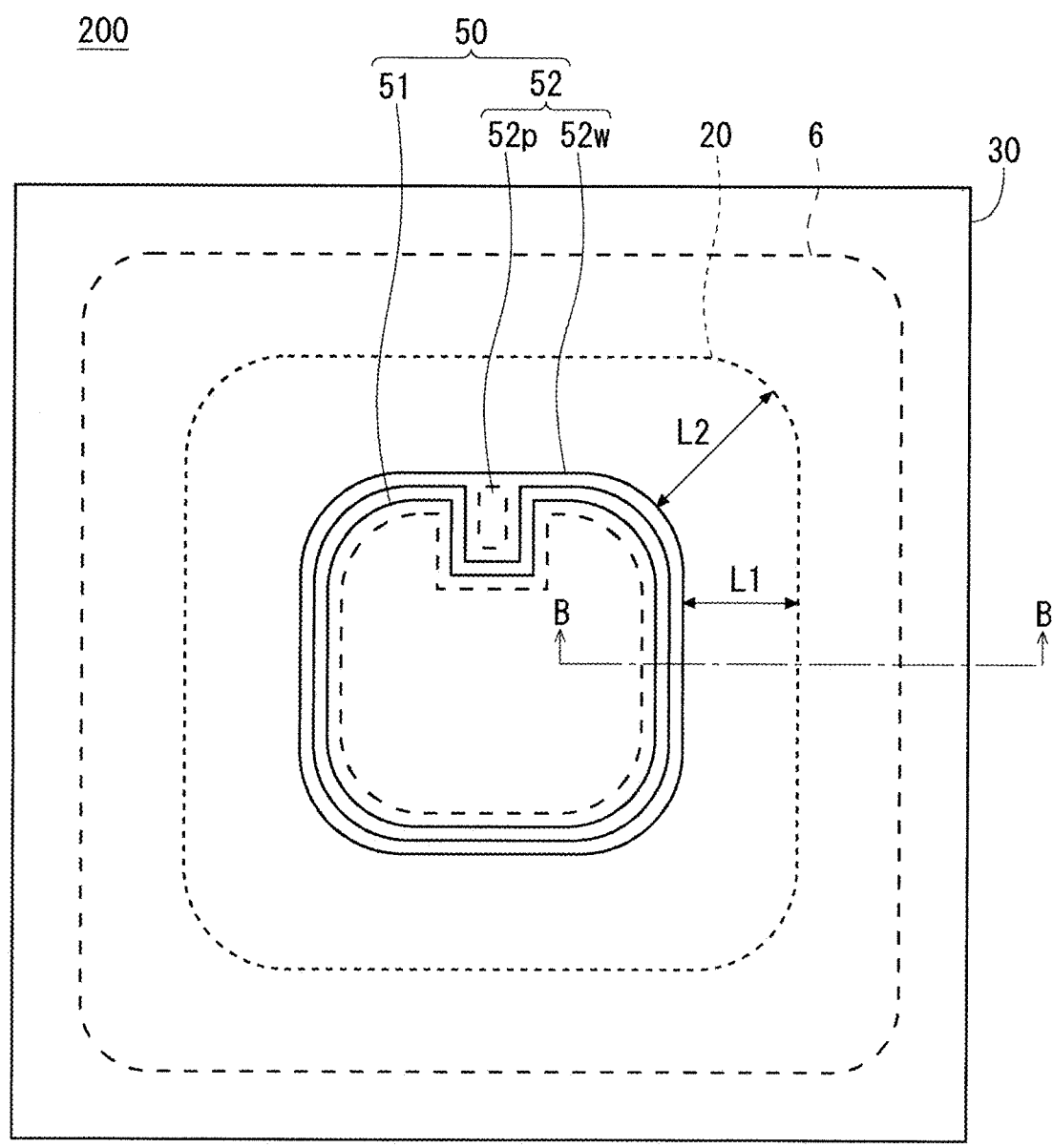
FIG. 11 A plan view illustrating a configuration of the semiconductor device according to the embodiment 2 of the present invention.
Figure 12:
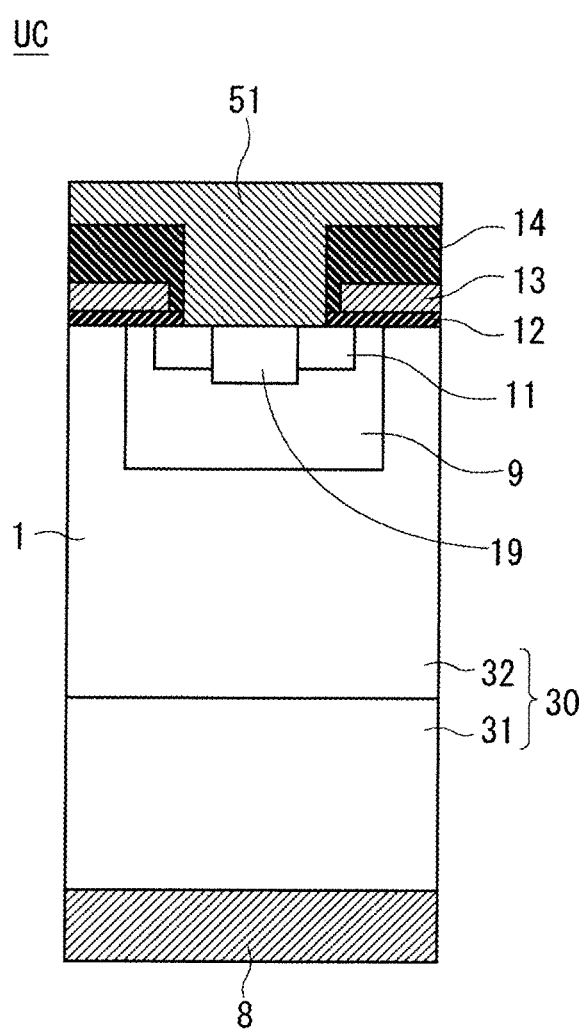
FIG. 12 A partial cross-sectional view illustrating a configuration of a unit cell of the semiconductor device according to the embodiment 2 of the present invention.

FIG. 10 is a partial cross-sectional view illustrating a configuration of a MOSFET 200 which is a semiconductor device according to an embodiment 2 of the present invention. FIG. 11 is a plan view of the MOSFET 200, and a cross-sectional view along a B-B line in FIG. 11 corresponds to FIG. 10. FIG. 12 is a cross-sectional view illustrating a configuration of a unit cell UC which is a minimum unit structure of a MOSFET in the inner side region RI which is the active region. The plurality of unit cells UC, each of which is illustrated in FIG. 12, are arranged in the inner side region RI in the MOSFET 200 (the unit cell UC in an outermost periphery is illustrated in a left end portion in FIG. 10). In FIGS. 10 to 12, the same reference numerals are assigned to the elements having the same function as the constituent elements of the SBD 100 according to the embodiment 1 illustrated in FIG. 1 and FIG. 2, thus the description overlapping with the embodiment 1 is omitted.

As illustrated in FIG. 10, the MOSFET 200 is formed using the epitaxial substrate 30 made up of the single crystal substrate 31 and the epitaxial layer 32 formed on the single crystal substrate 31. The single crystal substrate 31 is a semiconductor substrate made up of n-type (first conductivity type) silicon carbide (SiC), and the epitaxial layer 32 is a semiconductor layer made up of SiC epitaxially grown on the single crystal substrate 31. That is to say, the MOSFET 200 is SiC-MOSFET. In the present embodiment, the epitaxial substrate 30 having 4H polytype is used.

A p-type (second conductivity type) element well region 9 is selectively formed on a surface layer portion on the front side of the epitaxial layer 32 in the active region. Each of an n-type source region 11 and a p-type contact region 19 having a higher impurity concentration than the element well region 9 is selectively formed on a surface layer portion of the element well region 9.

A p-type terminal well region 20 is selectively formed on the surface layer portion on the front side of the epitaxial layer 32 in the terminal region to surround the active region. The terminal well region 20 includes a boundary region 21 having contact with a boundary between the inner side region RI and the outer side region RO and an extension region 22 extending outside from the boundary region 21 to surround the boundary region 21 and having a lower impurity concentration than the boundary region 21. The boundary region 21 further includes a low concentration part 21a having a relatively low impurity concentration and a high concentration part 21b formed on a surface layer portion of the low concentration part 21a and having a relatively high impurity concentration. Herein, a type of the high concentration part 21b is not limited to a p type, however, an n type is also applicable.

The n-type region of the epitaxial layer 32 except for the impurity regions described above (the element well region 9, the source region 11, the contact region 19, and the terminal well region 20) constitutes the drift layer 1 in which current flows by drift. An impurity concentration of the drift layer 1 is lower than that of the single crystal substrate 31. Thus, the single crystal substrate 31 has lower resistivity than the drift layer 1. Herein, the impurity concentration of the drift layer 1 is equal to or larger than $1\times10^{14}/cm^3$ and equal to or smaller than $1\times10^{17}/cm^3$.

As shown by dotted lines in FIG. 11, the terminal well region 20 is a frame-like (ring-like) region surrounding the active region in a plan view, and functions as a so-called guard ring. As illustrated in FIG. 10, assuming that an end portion of an inner side (inner peripheral side) of the terminal well region 20 is a boundary, an inner side of the boundary is defined as the inner side region RI which is the active region and an outer side thereof is defined as the outer side region RO which is the terminal region. The outer side region RO is a frame-like region surrounding the inner side region RI in a plan view, and includes a straight portion which is a straight region along each side of a semiconductor chip and a corner portion which is a curved region between the straight portions adjacent to each other.

A gate insulating film 12 is formed on the front surface S2 of the epitaxial substrate 30 in the active region to extend on the source region 11, the element well region 9, and the drift layer 1, and the gate electrode 13 is formed thereon. A surface layer portion of the element well region 9 covered by the gate insulating film 12 and the gate electrode 13, that is to say, a portion between the source region 11 and the drift layer 1 in the element well region 9 constitutes a channel region in which an inversion channel is formed when the MOSFET 200 enters an ON state.

The gate electrode 13 is covered by an interlayer insulating film 14 in the active region, and a source electrode 51 is formed on the interlayer insulating film 14. Thus, the gate insulating film 12 and the gate electrode 13 are electrically insulated from each other by the interlayer insulating film 14.

The source electrode 51 is connected to the source region 11 and the contact region 19 through a contact hole formed in the interlayer insulating film 14. The source electrode 51 and the contact region 19 form ohmic contact. The back surface electrode 8 functioning as a drain electrode is provided on the back surface S1 of the epitaxial substrate 30.

As illustrated in FIG. 10, the gate insulating film 12, the gate electrode 13, the interlayer insulating film 14, and the source electrode 51 partially go beyond the boundary between the inner side region RI and the outer side region RO and extend to the outer side region RO. The source electrode 51 drawn to the outer side region RO is connected to the high concentration part 21b of the terminal well region 20 through a contact hole formed in the interlayer insulating film 14 to have ohmic contact or Schottky contact with the high concentration part 21b. The gate electrode 13 drawn to the outer side region RO is disposed on the high concentration part 21b of the terminal well region 20 via the gate insulating film 12, and extends to have a frame-like shape in a plan view in the manner similar to the high concentration part 21b.

The field insulating film 3, a gate wiring electrode 52, and the surface protection film 6 are provided on the front surface S2 of the epitaxial substrate 30 in the terminal region. The illustration of the field insulating film 3 and the surface protection film 6 is omitted in a plan view in FIG. 11. The position of the end portion of the surface protection film 6, that is to say, the outline of the surface protection film 6 is shown by a broken line.

The field insulating film 3 covers part of the boundary region 21 in the terminal well region 20 and the whole extension region 22, and goes beyond an outer peripheral end of the terminal well region 20 to extend to an outer side of the terminal well region 20. The field insulating film 3 is not provided in the inner side region RI. In other words, the field insulating film 3 has an opening having the inner side region RI.

The gate wiring electrode 52 is formed on the interlayer insulating film 14 covering the gate electrode 13 drawn to the outer side region RO, and is connected to the gate electrode 13 through a contact hole formed in the interlayer insulating film 14. The gate wiring electrode 52 functions as an electrode receiving a gate signal (control signal) for controlling an electrical path between the source electrode 51 and the back surface electrode 8. The gate wiring electrode 52 is separated from the source electrode 51, and is also electrically insulated from the source electrode 51.

The gate wiring electrode 52 extends to have a frame-like shape in a plan view in the manner similar to the gate electrode 13 drawn to the outer side region RO. In the present embodiment, the gate wiring electrode 52 is made up of a gate wiring 52w provided to surround the source electrode 51 and a gate pad 52p provided to enter a concave portion provided in one side of the rectangular source electrode 51 as illustrated in FIG. 11, and the gate wiring 52w and the gate pad 52p are connected to each other. The gate wiring electrode 52 illustrated in FIG. 10 corresponds to the gate wiring 52w in FIG. 11. The gate pad 52p functions as an external terminal for inputting the gate signal. In FIG. 11, the gate pad 52p is provided in the straight portion of the terminal region, but may also be provided in the corner portion.

In the present embodiment, a surface electrode 50 includes the source electrode 51 and the gate wiring electrode 52. The surface electrode 50 is provided to have contact with at least part of the front surface S2 of the inner side region RI in the epitaxial substrate 30. The surface electrode 50 is formed over the whole inner side region RI, and partially goes beyond the boundary between the inner side region RI and the outer side region RO to extend to the outer side region RO. The surface electrode 50 is provided so that the whole surface electrode 50 is located on the interlayer insulating film 14.

In FIG. 10, an inner peripheral end of the field insulating film 3 has contact with the end portion of the interlayer insulating film 14, and the gate electrode 13 and the surface electrode 50 are formed on an inner side in relation to the inner peripheral end of the field insulating film 3. However, the interlayer insulating film 14, the gate electrode 13, and the surface electrode 50 may be formed to be located on the field insulating film 3. In this case, the source electrode 51 is connected to the high concentration part 21*b* of the terminal well region 20 through a contact hole passing through both the interlayer insulating film 14 and the field insulating film 3.

The surface protection film 6 covers the source electrode 51 and the gate wiring electrode 52 on the end edge portion of the surface electrode 50 and at least part of the outer side region RO in the epitaxial substrate 30. The surface protection film 6 has an opening on each of a center portion of the source electrode 51 and a center portion of the gate pad 52*p* as illustrated in FIG. 11. Accordingly, each of the source electrode 51 and the gate pad 52*p* can function as an external terminal.

In the MOSFET 200 of the embodiment 2, the outer peripheral end of the surface electrode 50 in the corner portion of the outer side region RO is located on the inner side in relation to the outer peripheral end of the surface electrode 50 in the straight portion of the outer side region RO based on a position of the outer peripheral end of the terminal well region 20. That is to say, when a distance from the outer peripheral end of the terminal well region 20 to the outer peripheral end of the surface electrode 50, that is a distance from the outer peripheral end of the terminal well region 20 to the outer peripheral end of the gate wiring 52*w* is L, in a case where the outer peripheral end of the gate wiring 52*w* is located on an inner side in relation to the outer peripheral end of the terminal well region 20 as illustrated in FIG. 10, a distance L2 in the corner portion of the outer side region RO is larger than a distance L1 in the straight portion of the outer side region RO as illustrated in FIG. 11. That is to say, a relationship of L2>L1 is established.

Although the illustration is omitted, in a case where the outer peripheral end of the gate wiring 52*w* is located on an inner side in relation to the outer peripheral end of the terminal well region 20, when a distance from the outer peripheral end of the terminal well region 20 to the outer peripheral end of the surface electrode 50, that is a distance from the outer peripheral end of the terminal well region 20 to the outer peripheral end of the gate wiring 52*w* is L, a distance L2 in the corner portion of the outer side region RO is smaller than a distance L1 in the straight portion of the outer side region RO. That is to say, a relationship of L1>L2 is established.

Also in the embodiment 2, the plurality of terminal well regions 20 disposed separately from each other in a nested form may be provided as with the terminal well region 2 illustrated in FIG. 7 and FIG. 8. The surface electrode 50 is electrically connected to at least one of the plurality of terminal well regions 20.

In the present embodiment, a material of the epitaxial substrate 30 is SiC. However, it is not limited to SiC, but Si or the other wideband gap semiconductor such as gallium nitride (GaN) is also applicable, for example.

The semiconductor device according to the present embodiment may be a transistor other than a MOSFET, thus may be a junction FET (JFET) or an insulated gate bipolar transistor (IGBT), for example. Furthermore, a planar type transistor is exemplified in the present embodiment, however, a trench type transistor is also applicable.

Modification Example

Figure 13:
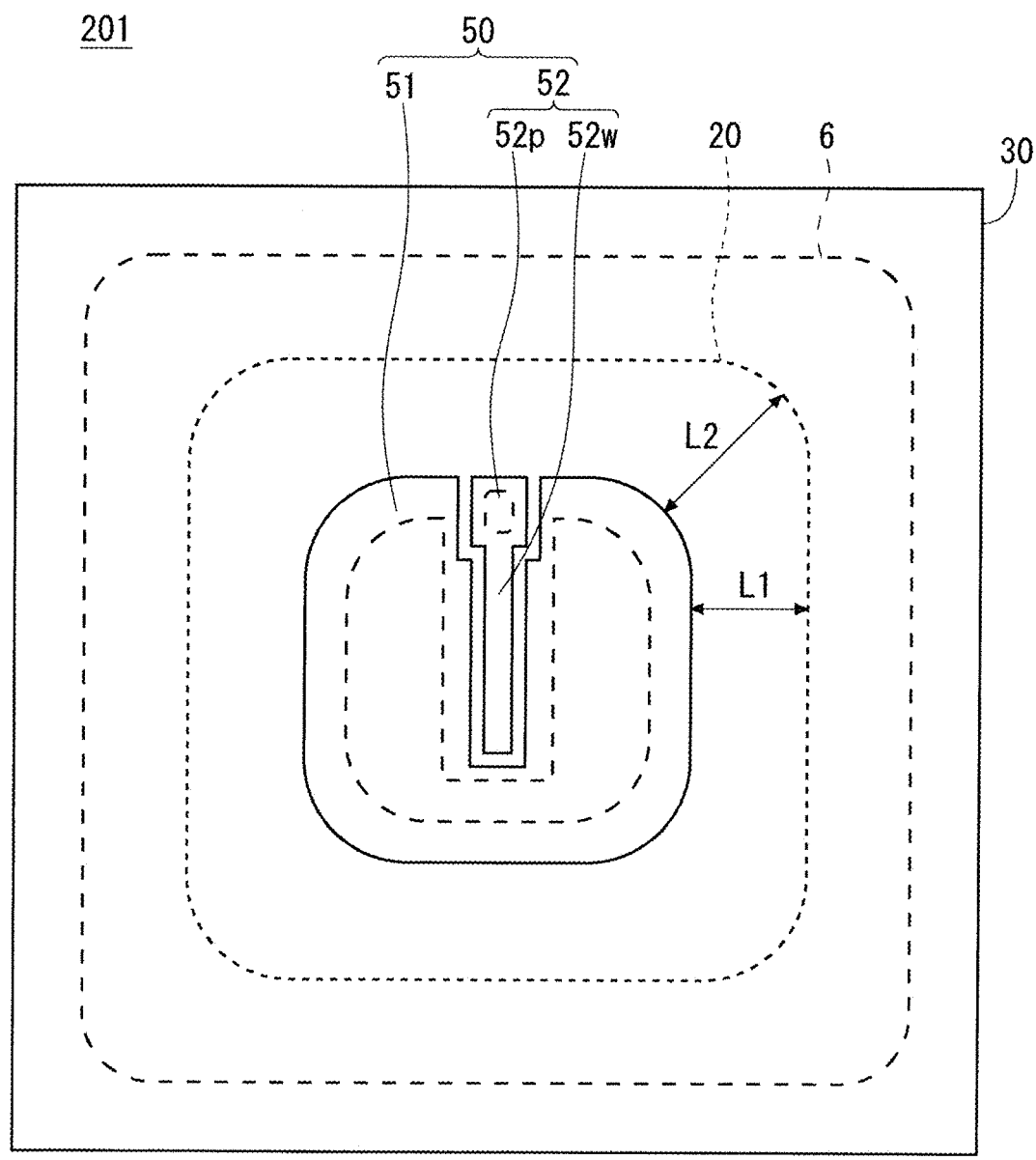
FIG. 13 A plan view illustrating a configuration of a modification example of the semiconductor device according to the embodiment 2 of the present invention.

FIG. 13 is a plan view illustrating a configuration of a MOSFET 201 according to a modification example of the embodiment 2, and is a drawing corresponding to FIG. 11. In the MOSFET 201 in FIG. 13, a concave portion provided in one side of the rectangular source electrode 51 extends to enter deeply inside the source electrode 51, and the gate wiring electrode 52 further extends to enter the concave portion. That is to say, in the MOSFET 200 in FIG. 11, only the gate pad 52*p* enters the concave portion provided in one side of the source electrode 51, and the gate wiring 52*w* is provided to surround the source electrode 51, however, in the MOSFET 201 in FIG. 13, the elongated gate wiring 52*w* enters the concave portion of the source electrode 51, and the gate pad 52*p* is provided in an entrance portion of the concave portion.

Also in the MOSFET 201, the outer peripheral end of the surface electrode 50 in the corner portion of the outer side region RO is located on the inner side in relation to the outer peripheral end of the surface electrode 50 in the straight portion of the outer side region RO based on a position of the outer peripheral end of the terminal well region 20. That is to say, when a distance from the outer peripheral end of the terminal well region 20 to the outer peripheral end of the surface electrode 50, that is a distance from the outer peripheral end of the terminal well region 20 to the outer peripheral end of the source electrode 51 is L, in a case where the outer peripheral end of the source electrode 51 is located on an inner side in relation to the outer peripheral end of the terminal well region 20, a distance L2 in the corner portion of the outer side region RO is larger than a distance L1 in the straight portion of the outer side region RO as illustrated in FIG. 13. That is to say, a relationship of L2>L1 is established.

Although the illustration is omitted, in a case where the outer peripheral end of the source electrode 51 is located on an inner side in relation to the outer peripheral end of the terminal well region 20, when a distance from the outer peripheral end of the terminal well region 20 to the outer peripheral end of the surface electrode 50, that is a distance from the outer peripheral end of the terminal well region 20 to the outer peripheral end of the source electrode 51 is L, a distance L2 in the corner portion of the outer side region RO is smaller than a distance L1 in the straight portion of the outer side region RO. That is to say, a relationship of L1>L2 is established.

[Operation]

An operation of the MOSFET 200 of the embodiment 2 illustrated in FIG. 10 is described with two states.

A first state is a state where positive voltage equal to or larger than a threshold value is applied to the gate electrode 13, and this state is referred to as "ON state". When the MOSFET 200 is in the ON state, an inversion channel is formed in a channel region. The inversion channel functions as a path for electrons as carriers flowing between the source region 11 and the drift layer 1. In the ON state, when high voltage is applied to the back surface electrode 8 based on potential of the source electrode 51, current passing through the single crystal substrate 31 and the drift layer 1 flows. At this time, the voltage between the source electrode 51 and the back surface electrode 8 is referred to as "ON voltage", and current flowing between the source electrode 51 and the back surface electrode 8 is referred to as "ON current". The ON current flows only in the active region including the channel, and does not flow in the terminal region.

A second state is a state where voltage smaller than a threshold value is applied to the gate electrode 13, and this state is referred to as "OFF state". When the MOSFET 200 is in the OFF state, an inversion channel is not formed in a channel region, thus the ON current does not flow. Thus, when high voltage is applied between the source electrode 51 and the back surface electrode 8, this high voltage is maintained. At this time, the voltage between the gate electrode 13 and the source electrode 51 is significantly small compared with the voltage between the source electrode 51 and the back surface electrode 8, thus the high voltage is also applied between the gate electrode 13 and the back surface electrode 8.

In the OFF state, also in the terminal region, the high voltage is applied between the gate wiring electrode 52 and the back surface electrode 8 and between the gate electrode 13 and the back surface electrode 8. An electrical contact between the boundary region 21 in the terminal well region 20 and the source electrode 51 is formed in the terminal region as with a case where an electrical contact between the element well region 9 and the source electrode 51 is formed in the active region, thus avoided is that high electrical field is applied to the gate insulating film 12 and the interlayer insulating film 14.

The terminal region in the MOSFET 200 functions in the manner similar to the OFF state of the SBD 100 described in the embodiment 1. That is to say, the high electrical field is applied near a pn junction interface between the drift layer 1 and the terminal well region 20, and when voltage exceeding critical electrical field is applied to the back surface electrode 8, avalanche breakdown occurs. Normally, rated voltage is determined so that the MOSFET 200 is used within a range in which the avalanche breakdown does not occur.

In the OFF state, the depletion layer expands in a direction (lower direction) toward the single crystal substrate 31 and an outer peripheral direction (right direction) of the drift layer 1 from the pn junction interface between the drift layer 1 and the element well region 9 and between the drift layer 1 and the terminal well region 20.

Considered herein is a case where the MOSFET 200 is in the OFF state under high humidity. A sealing resin provided to cover a semiconductor chip may contain moisture. For example, when the surface protection film 6 is made up of a resin material having high water absorption properties such as polyimide, there is a possibility that the surface protection film 6 contains much moisture under high humidity and the moisture reaches the surfaces of the field insulating film 3, the interlayer insulating film 14, and the surface electrode 50. When the surface protection film 6 is made up of a material such as SiN having high resistance, there is a possibility that a crack occurs easily in the surface protection film 6 around the end portion of the surface electrode 5 by a stress generated in the processes, and the surface electrode 5 is exposed to the moisture through the crack. In such a state, the end edge portion of the drift layer 1 acts as a positive electrode by voltage applied to the MOSFET 200 in the OFF state, and the surface electrode 50 acts as a negative electrode. A reduction reaction of oxygen expressed by the chemical formula (1) and a formation reaction of hydrogen expressed by the chemical formula (2) described in the embodiment 1 occur near the surface electrode 50 which becomes the negative electrode.

Accordingly, a concentration of hydroxide ion increases near the surface electrode 50 (when the negative voltage is applied to the gate wiring electrode 52, the concentration of hydroxide ion further increases around the gate wiring electrode 52). Hydroxide ion chemically reacts with the surface electrode 50, thus an insulating material is deposited on an upper surface and a lateral surface of the surface electrode 50 in the outer end edge portion of the surface electrode 50 (a right end in FIG. 10).

The field intensity is generally high due to the occurrence of the two-dimensional potential gradient in the corner portion (the curved portion) of the terminal region, thus a deposition of the insulating material significantly occurs on the surface of the surface electrode 50. When the surface protection film 6 is pushed up by the deposition of the aluminum hydroxide, the peeling of the surface protection film 6 may occur at an interface between the surface electrode 50 and the surface protection film 6 in some cases.

The peeling of the surface protection film 6 extends on the interlayer insulating film 14 and the field insulating film 3 in some cases. In other words, the peeling of the surface protection film 6 also occurs at an interface between the interlayer insulating film 14 and the surface protection film 6 and between the field insulating film 3 and the surface protection film 6 in some cases. If a cavity is formed on the interlayer insulating film 14 and the field insulating film 3 by this peeling, there is a possibility that moisture enters the cavity and causes an excess leakage current or an aerial discharge occurs in the cavity, thus an element breakdown occurs in the MOSFET 200.

If a cavity is formed between the source electrode 51 and the gate wiring electrode 52 by the peeling of the surface protection film 6, there is a possibility that moisture enters the cavity and causes an excess leakage current flowing between the source and the gate.

Particularly when the epitaxial substrate 30 is made of SiC, a width of the terminal well region 2 and a width from the terminal well region 20 to the end edge portion of the drift layer 1 can be designed to be small by using high insulating breakdown electrical field of SiC. In such a design, a distance from the end edge portion of the drift layer 1 which becomes the positive electrode in the OFF state to the surface electrode 50 which becomes the negative electrode decreases. Thus, the field intensity of the terminal region further increases, and the generation of aluminum hydroxide in the end portion of the surface electrode 50 is promoted. As a result, the peeling of the surface protection film 6 from the surface electrode 50 occurs more significantly.

In contrast, in the MOSFET 200 in the embodiment 2, the outer peripheral end of the surface electrode 50 in the corner portion of the terminal region is located on the inner side in relation to the outer peripheral end of the surface electrode 50 in the straight portion of the terminal region based on the position of the outer peripheral end of the terminal well region 20. Thus, the field intensity in the end portion of the surface electrode 50 in the corner portion of the terminal region is smaller than the field intensity of the end potion of the surface electrode 50 in the straight portion of the terminal region. Accordingly, the generation of aluminum hydroxide is suppressed in the end portion of the surface electrode 50 in the corner portion of the terminal region. As a result, obtained is an effect that increase in a leakage current and the aerial discharge caused by the peeling of the surface protection film 6 can be avoided.

The effect of suppressing the generation of aluminum hydroxide in the corner portion of the terminal region is also obtained in the surface electrodes 50 included in the MOSFET 201 in the modification example of the embodiment 2 (FIG. 13). That is to say, the outer peripheral end of the source electrode 51 in the corner portion of the terminal region is located on the inner side in relation to the outer peripheral end of the source electrode 51 in the straight portion of the terminal region based on the position of the outer peripheral end of the terminal well region 20, thus the field intensity in the end portion of the source electrode 51 in the corner portion of the terminal region can be made smaller than the field intensity in the end portion of the source electrode 51 in the straight portion of the terminal region. Thus, the generation of aluminum hydroxide in the end portion of the source electrode 51 in the corner portion can be suppressed, and the increase in the leakage current and the aerial discharge caused by the peeling of the surface protection film 6 can be avoided.

[Manufacturing Method]

A method of manufacturing the MOSFET 200 according to the embodiment 2 is described next.

Firstly, a low-resistance single crystal substrate 31 including an n-type impurity at a relatively high concentration (n+) is prepared. In the present embodiment, the single crystal substrate 31 is an SiC substrate having a polytype of 4H, and has an off angle of four degrees or eight degrees.

Subsequently, SiC is epitaxially grown on the single crystal substrate 31 to form the n-type epitaxial layer 32 having an impurity concentration equal to or larger than $1 \times 10^{14}/cm^3$ and equal to or smaller than $1 \times 10^{17}/cm^3$ on the single crystal substrate 31. Accordingly, the epitaxial substrate 30 made up of the single crystal substrate 31 and the epitaxial layer 32 is obtained.

Next, a photolithography process of forming a resist mask and an ion implantation process of performing ion implantation using the resist mask as an implantation mask to form an impurity region in the surface layer portion of the epitaxial layer 32 are repeated, thus the terminal well region 20, the element well region 9, the contact region 19, and the source region 11 are formed in the epitaxial layer 32.

In the ion implantation, nitrogen (N), for example, is used as the n-type impurity, and Al or B, for example, is used as the p-type impurity. The element well region 9 and the low concentration region 21a in the terminal well region 20 can be collectively formed in the same ion implantation process. Both the contact region 19 and the high concentration region 21b in the terminal well region 20 can be collectively formed in the same ion implantation process.

The impurity concentration of each of the element well region 9 and the low concentration region 21a in the terminal well region 20 is preferably equal to or larger than $1.0 \times 10^{18}/cm^3$ and equal to or smaller than $1.0 \times 10^{20}/cm^3$. The impurity concentration of the source region 11 is preferably equal to or larger than $1.0 \times 10^{19}/cm^3$ and equal to or smaller than $1.0 \times 10^{21}/cm^3$ in a higher range than that of the element well region 9. A dose amount of the contact region 19 and the extension region 22 in the terminal well region 20 is preferably equal to or larger than $0.5 \times 10^{13}/cm^2$ and equal to or smaller than $5 \times 10^{13}/cm^2$, and is $1.0 \times 10^{13}/cm^2$, for example.

When the impurity is Al, implantation energy of ion implantation is equal to or larger than 100 keV and equal to or smaller than 700 keV, for example. In this case, the impurity concentration of the extension region 22 converted from the dose amount [$cm^{-2}$] described above is equal to or larger than $1 \times 10^{17}/cm^3$ and equal to or smaller than $1 \times 10^{19}/cm^3$. When the impurity is N, implantation energy of ion implantation is equal to or larger than 20 keV and equal to or smaller than 300 keV, for example.

Subsequently, annealing is performed at a temperature equal or larger than 1500° C. using a thermal processing device. Accordingly, the impurity added by the ion implantation is activated.

Next, an $SiO_2$ film having a thickness equal to or larger than 0.5 μm and equal to or smaller than 2 μm is formed on the front surface S2 of the epitaxial substrate 30 by a CVD method, for example. Then, the $SiO_2$ film is patterned by a photolithography process and an etching process to form the field insulating film 3. At this time, the field insulating film 3 is patterned to have a shape of covering part of the terminal well region 20 and going beyond the end portion of the terminal well region 20 to extend to the outer peripheral side of the terminal well region 2.

Subsequently, the surface of the epitaxial layer 32 which is not covered by the field insulating film 3 is thermally oxidized to form a $SiO_2$ film as the gate insulating film 12. Then, a polycrystal silicon film having conductivity is formed on the gate insulating film 12 by a decompression CVD method, and the polycrystal silicon film is patterned by a photolithography process and an etching process to form the gate electrode 13. At this time, the gate electrode 13 may be formed to be located on the field insulating film 3.

Subsequently, an $SiO_2$ film as the interlayer insulating film 14 is formed by a CVD method. Then, contact holes passing through the gate insulating film 12 and the interlayer insulating film 14 to reach each of the contact region 19, the source region 11, and the high concentration part 21b of the terminal region are formed by a photolithography process and an etching process. In this process, the contact hole passing through the interlayer insulating film 14 to reach the gate electrode 13 is formed in the terminal region, and the interlayer insulating film 14 located on the field insulating film 3 and on the end edge portion of the epitaxial layer 32 is removed.

Next, a material layer of the surface electrode 50 is formed on the front surface S2 of the epitaxial substrate 30 by a sputtering method or a deposition method, for example. A material layer of the back surface electrode 8 is provided on the back surface S1 of the epitaxial substrate 30 by a method similar thereto.

Metal including one or some of Ti, Ni, Al, Cu, and Au or Al alloy such as Al—Si, for example, can be used as a material of the surface electrode 50. Metal including one or some of Ti, Ni, Al, Cu, and Au, for example, is used as the material of the back surface electrode 8. A silicide film may be formed in advance by thermal processing on a portion having contact with the surface electrode 50 or the back surface electrode 8 in the epitaxial substrate 30. The back surface electrode 8 may be formed at the end of all of the processes.

Next, the surface electrode 50 is patterned by a photolithography process and an etching process to separate the surface electrode 50 into the source electrode 51 and the gate wiring electrode 52. At this time, the surface electrode 50 is patterned so that the outer peripheral end of the surface electrode 50 in the corner portion of the terminal region is located on the inner side in relation to the outer peripheral end of the surface electrode 50 in the straight portion of the terminal region based on the position of the outer peripheral end of the terminal well region 20.

Finally, the surface protection film 6 is formed to cover the end edge portion of the surface electrode 50 and at least part of the outer side region RO in the epitaxial substrate 30 to obtain the MOSFET 200 illustrated in FIG. 10. The surface protection film 6 is formed into a desired shape by applying and exposing photoactive polyimide, for example.

[Outline]

As described above, according to the MOSFET 200 of the embodiment 2 and the MOSFET 201 of the modification example of the embodiment 2, the generation of aluminum hydroxide in the end portion of the surface electrode 50 in the corner portion of the terminal region can be suppressed, and the peeling of the surface protection film 6 is thereby avoided. Thus, the increase in the leakage current and the aerial discharge caused by the peeling of the surface protection film 6 can be avoided, and insulation reliability of the MOSFET can be increased.

Embodiment 3

The semiconductor device according to the embodiments 1 and 2 described above is applied to a power conversion device in the present embodiment. Described hereinafter is a case where the semiconductor device according to the embodiments 1 and 2 is applied to a three-phase inverter as an embodiment 3.

FIG. 14 is a block diagram schematically illustrating a configuration of a power conversion system to which a power conversion device 2000 according to the present embodiment is applied.

A power conversion system illustrated in FIG. 14 includes a power source 1000, the power conversion device 2000, and a load 3000. The power source 1000 is a direct current power source, and supplies a direct current power to the power conversion device 2000. The power source 1000 can be made up of various components, thus can be made up of a direct current system, a solar battery, or a storage battery, for example, and may also be made up of a rectification circuit connected to an alternating current system or an AC/DC converter. The power source 1000 may also be made up of a DC/DC converter converting a direct current power being output from a direct current system into a predetermined power.

The power conversion device 2000 is a three-phase inverter connected between the power source 1000 and the load 3000, converts a direct current power supplied from the power source 1000 into an alternating current power, and supplies the alternating current power to the load 3000. As illustrated in FIG. 14, the power conversion device 2000 includes a main conversion circuit 2001 converting a direct current power into an alternating current power and outputting the alternating current power, a drive circuit 2002 outputting a drive signal for driving each switching element of the main conversion circuit 2001, and a control circuit 2003 outputting a control signal for controlling the drive circuit 2002 to the drive circuit 2002.

The load 3000 is a three-phase electrical motor driven by the alternating current power supplied from the power conversion device 2000. The load 3000 is not for a specific purpose of usage, but is an electrical motor mounted on various types of electrical devices, thus is used as an electrical motor for a hybrid automobile, an electrical automobile, a railroad vehicle, an elevator, or an air-conditioning machine, for example.

Details of the power conversion device 200 are described hereinafter. The main conversion circuit 2001 includes a switching element and a reflux diode (not shown), and when the switching element is switched, the main conversion circuit 2001 converts the direct current power supplied from the power source 1000 into the alternating current power, and supplies the alternating current power to the load 3000. Examples of a specific circuit configuration of the main conversion circuit 2001 include various configurations, however, the main conversion circuit 2001 according to the present embodiment is a three-phase full-bridge circuit with two levels, and can be made up of six switching elements and six reflux diodes antiparallelly connected to each switching element. The semiconductor device according to any one of the embodiments 1 and 2 described above is applied to at least one of each switching element and each reflux diode of the main conversion circuit 2001. The six switching elements are connected two by two in series to constitute upper and lower arms, and each pair of the upper and lower arms constitutes each phase (U phase, V phase, and W phase) of a full-bridge circuit. Output terminals of the pair of the upper and lower arms, that is to say, three output terminals of the main conversion circuit 2001 are connected to the load 3000.

The drive circuit 2002 generates a drive signal for driving a switching element of the main conversion circuit 2001, and supplies the drive signal to a control electrode of the switching element of the main conversion circuit 2001. Specifically, the drive circuit 2002 outputs a drive signal for making the switching element enter an ON state and a drive signal for making the switching element enter an OFF state to a control electrode of each switching element in accordance with a control signal from the control circuit 2003 describe hereinafter. When the switching element is kept in the ON state, the drive signal is a voltage signal (ON signal) larger than a threshold voltage of the switching element, and when the switching element is kept in the OFF state, the drive signal is a voltage signal (OFF signal) smaller than the threshold voltage of the switching element.

The control circuit 2003 controls the switching element of the main conversion circuit 2001 so that a desired electrical power is supplied to the load 3000. Specifically, the control circuit 2003 calculates a time (on time) at which each switching element of the main conversion circuit 2001 should enter the ON state based on the electrical power to be supplied to the load 3000. For example, the control circuit 2003 can control the main conversion circuit 2001 by pulse width modulation (PWM) control modulating the on time of the switching element in accordance with the voltage to be output. Then, the control circuit 2003 outputs to a control command (control signal) to the drive circuit 2002 so that the ON signal is output to the switching element which should enter the ON state and the OFF signal is output to the switching element which should enter the OFF state at each point of time. The drive circuit 2002 outputs the ON signal or the OFF signal as the drive signal to the control electrode of each switching element in accordance with the control signal.

The semiconductor device according to the embodiment 1 can be applied as a reflux diode of the main conversion circuit 2001 in the power conversion device according to the present embodiment. The semiconductor device according to the embodiment 2 can be applied as a switching element of the main conversion circuit 2001 in the power conversion device according to the present embodiment. When the semiconductor device according to the embodiment 1 and the embodiment 2 is applied to the power conversion device 2000 in this manner, the semiconductor device is generally embedded in gel or resin in use, however, these materials cannot completely block moisture, thus the insulation protection of the semiconductor device is maintained by the configuration described in the embodiment 1 and he embodiment 2. The reliability can be thereby increased.

Described in the above present embodiment is the example of applying the semiconductor device according to the embodiments 1 and 2 to the three-phase inverter with two levels. However, the semiconductor device according to the embodiments 1 and 2 is not limited thereto, but can be applied to various power conversion devices. Described in the present embodiment is the power conversion device with two levels, but a power conversion device with three levels or a multilevel power conversion device may also be applied. When an electrical power is supplied to a single phase load, the semiconductor device according to the embodiments 1 and 2 may be applied to a single-phase inverter. When the electrical power is supplied to a direct current load, for example, the semiconductor device according to the embodiments 1 and 2 can be applied to a DC/DC converter or an AC/DC converter.

The power conversion device applying the semiconductor device according to the embodiments 1 and 2 can be used not only in the case where the load is the electrical motor but can be used as a power source device of an electrical discharge machine, a laser beam machine, an induction heat cooking machine, or a wireless chagrining system, and further can also be used as a power conditioner of a solar power system or an electricity storage system, for example.

According to the present invention, each embodiment can be arbitrarily combined, or each embodiment can be appropriately varied or omitted within the scope of the invention.

Although the present invention is described in detail, the foregoing description is in all aspects illustrative and does not restrict the invention. It is therefore understood that numerous modifications and variations can be devised without departing from the scope of the invention. For example, cases where optional constituent elements are to be modified, added, or omitted, further, at least one of the constituent elements of at least one of the embodiments is extracted and then combined with constituent elements of the other embodiment, are involved.

The "one" constituent element described in each embodiment described above may be "one or more" constituent elements so far as consistent with the embodiments. Further, constituent elements constituting the invention are conceptual units. Thus, one constituent element may include multiple structures, and one constituent element may correspond to part of some structure. The constituent element of the present invention includes a structure having a different configuration or a different shape as long as the structure of the different configuration or the different shape achieves the same function.

EXPLANATION OF REFERENCE SIGNS

1 drift layer, 2 terminal well region, 3 field insulating film, 5 surface electrode, 5a Schottky electrode, 5b electrode pad. 6 surface protection film, 8 back surface electrode, 9 element well region, 11 source region, 12 gate insulating film, 13 gate electrode, 14 interlayer insulating film, 19 contact region, 20 terminal well region, 21 boundary region, 21a low concentration part, 21b high concentration part, 22 extension region, 30 epitaxial substrate, 31 single crystal substrate, 32 epitaxial layer, 50 surface electrode, 51 source electrode, 52 gate wiring electrode, 52p gate pad, 52w gate wiring, S1 back surface of epitaxial substrate, S2 front surface of epitaxial substrate, 100, 101 SBD, 200, 201 MOSFET, UC unit cell, RI inner side region, RO outer side region, 1000 power source, 2000 power conversion device, 2001 main conversion circuit, 2002 drive circuit, 2003 control circuit, 3000 load.

The invention claimed is:
1. A semiconductor device, comprising:
a semiconductor substrate made up of silicon carbide;
a drift layer of a first conductivity type formed on the semiconductor substrate and made up of silicon carbide;
a well region of a second conductivity type formed on a surface layer portion of the drift layer in an active region;
a source region of the first conductivity type formed on a surface layer portion of the well region;
a gate insulating film covering a channel region which is a region located between the source region and the drift layer in the well region;
a gate electrode formed on the gate insulating film;
an interlayer insulating film covering the gate electrode;
at least one terminal well region of the second conductivity type formed on the surface layer portion of the drift layer to surround the active region in a plan view in a terminal region outside the active region;
a field insulating film formed to cover part of the terminal well region on the drift layer;
a surface electrode formed on the drift layer on an inner side in relation to the field insulating film, electrically connected to the terminal well region and having a portion made up of metal including one or a plurality of Al, Cu, Mo, and Ni or Al alloy as a material;
an upper surface film formed on the field insulating film and the surface electrode to cover an end portion on an outer side of the surface electrode; and
a back surface electrode formed on a back surface of the semiconductor sub strate, wherein
the surface electrode includes:
a source electrode formed on the interlayer insulating film and electrically connected to the source region through a contact hole formed in the interlayer insulating film; and
a gate wiring formed on the interlayer insulating film to surround the source electrode in a plan view and electrically connected to the gate electrode through a contact hole formed in the interlayer insulating film,
the terminal region includes a straight portion and a curved corner portion in a plan view,
the end portion of the outer side of the surface electrode is located on an inner side in relation to the end portion of the outer side of the terminal well region, and
with respect to a distance from the end portion on the outer side of the terminal well region to the end portion on the outer side of the surface electrode, the distance in the corner portion of the terminal region is larger than the distance in the straight portion of the terminal region.

2. The semiconductor device according to claim 1, wherein
the terminal well region includes a boundary region and an extension region extending outside from the boundary region and having a lower impurity concentration than the boundary region.

3. The semiconductor device according to claim 2, wherein
the impurity concentration of the extension region is lower than an impurity concentration of the well region.

4. The semiconductor device according to claim 2, wherein
a dose amount of the extension region is equal to or larger than $0.5\times10^{13}/cm^2$ and equal to or smaller than $5\times10^{13}/cm^2$.

5. The semiconductor device according to claim 2, wherein
the impurity concentration of the extension region is equal to or larger than $1\times10^{17}/cm^3$ and equal to or smaller than $5\times10^{19}/cm^3$.

6. A power conversion device, comprising:
a main conversion circuit including the semiconductor device according to claim 1, converting electrical power which has been input, and outputting the electrical power;
a drive circuit outputting a drive signal for driving the semiconductor device to the semiconductor device; and
a control circuit outputting a control signal for controlling the drive circuit to the drive circuit.

7. A semiconductor device, comprising:
a semiconductor substrate;
a drift layer of a first conductivity type formed on the semiconductor substrate;
at least one terminal well region of a second conductivity type formed on a surface layer portion of the drift layer to surround an active region in a plan view in a terminal region outside the active region;
a field insulating film formed to cover part of the terminal well region on the drift layer;
a surface electrode formed on the drift layer on an inner side in relation to the field insulating film and electrically connected to the terminal well region;
an upper surface film formed on the field insulating film and the surface electrode to cover an end portion on an outer side of the surface electrode; and
a back surface electrode formed on a back surface of the semiconductor substrate, wherein
the terminal region includes a straight portion and a corner portion in a plan view,
an end portion of an outer side of the surface electrode in the corner portion of the terminal region is located on an inner side in relation to the end portion of the outer side of the surface electrode in the straight portion of the terminal region based on a position of an end portion of an outer side of the terminal well region,
the end portion of the outer side of the surface electrode is located on an outer side in relation to the end portion of the outer side of the terminal well region, and
with respect to a distance from the end portion on the outer side of the terminal well region to the end portion on the outer side of the surface electrode, the distance in the corner portion of the terminal region is smaller than the distance in the straight portion of the terminal region.

8. The semiconductor device according to claim 1, comprising
the plurality of terminal well regions formed separately from each other in a nested form.

9. The semiconductor device according to claim 7, comprising
he plurality of terminal well regions formed separately from each other in a nested form.

10. The semiconductor device according to claim 8, wherein
the surface electrode is electrically connected to at least one of the plurality of terminal well regions.

11. The semiconductor device according to claim 9, wherein
the surface electrode is electrically connected to at least one of the plurality of terminal well regions.

12. A power conversion device, comprising:
a main conversion circuit including the semiconductor device according to claim 7, converting electrical power which has been input, and outputting the electrical power;
a drive circuit outputting a drive signal for driving the semiconductor device to the semiconductor device; and
a control circuit outputting a control signal for controlling the drive circuit to the drive circuit.

\* \* \* \* \*